(12) United States Patent
Choi et al.

(10) Patent No.: US 12,486,960 B2
(45) Date of Patent: *Dec. 2, 2025

(54) LIGHTING DEVICE AND LAMP COMPRISING SAME

(71) Applicant: LG INNOTEK CO., LTD., Seoul (KR)

(72) Inventors: Se Yeon Choi, Seoul (KR); Do Yub Kim, Seoul (KR); Tae Kyung Na, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/021,947

(22) PCT Filed: Aug. 24, 2021

(86) PCT No.: PCT/KR2021/011241
§ 371 (c)(1),
(2) Date: Feb. 17, 2023

(87) PCT Pub. No.: WO2022/045713
PCT Pub. Date: Mar. 3, 2022

(65) Prior Publication Data
US 2023/0358384 A1 Nov. 9, 2023

(30) Foreign Application Priority Data

Aug. 25, 2020 (KR) .................. 10-2020-0106813

(51) Int. Cl.
*F21S 41/32* (2018.01)
*F21S 41/143* (2018.01)
(Continued)

(52) U.S. Cl.
CPC ............. *F21S 41/32* (2018.01); *F21S 41/143* (2018.01); *F21S 41/153* (2018.01);
(Continued)

(58) Field of Classification Search
CPC .. G02B 6/0033; G02B 6/0035; G02B 6/0036; G02B 6/0038; G02B 6/004;
(Continued)

(56) References Cited

U.S. PATENT DOCUMENTS 8,556,444 B2  10/2013  Kim et al.
9,741,700 B2   8/2017  Kim
(Continued)

FOREIGN PATENT DOCUMENTS

CN     105299557 A    2/2016
CN     106015955 A   10/2016
(Continued)

OTHER PUBLICATIONS

Machine translation of KR 20110139039 A retrieved from the FIT database of PE2E search. (Year: 2024).*
(Continued)

*Primary Examiner* — Colin J Cattanach
(74) *Attorney, Agent, or Firm* — Birch, Stewart, Kolasch & Birch, LLP

(57) ABSTRACT

A lighting device disclosed in an embodiment of this invention includes a reflective layer, a resin layer disposed on the reflective layer, a substrate disposed on the resin layer and including an electrode layer, a plurality of light emitting devices disposed between the resin layer and the substrate, and a light blocking layer disposed on the substrate, the electrode layer may include a first pattern region disposed adjacent to the light emitting device and a second pattern region disposed outside the first pattern region and having a pattern different in size from the first pattern region, and the light blocking pattern region may overlap in a vertical direction with the first pattern region.

18 Claims, 14 Drawing Sheets

(51) Int. Cl.
    *F21S 41/153*     (2018.01)
    *F21S 41/20*     (2018.01)
    *F21V 8/00*     (2006.01)
    *H01L 25/075*     (2006.01)
    *H10H 20/855*     (2025.01)
    *H10H 20/856*     (2025.01)
    *H10H 20/857*     (2025.01)

(52) U.S. Cl.
    CPC .......... *F21S 41/285* (2018.01); *G02B 6/0021* (2013.01); *H01L 25/0753* (2013.01); *H01L 2224/0612* (2013.01); *H01L 2224/0613* (2013.01); *H10H 20/855* (2025.01); *H10H 20/856* (2025.01); *H10H 20/857* (2025.01)

(58) Field of Classification Search
    CPC .. G02B 6/0041; G02B 6/0043; G02B 6/0021; H01L 33/52; H01L 33/54; H01L 33/56; H01L 33/58; H01L 33/60; H01L 2224/0613; H01L 33/62; H01L 25/0753; H01L 2224/0612; H10H 20/855; H10H 20/856; H10H 29/8585; H10H 29/857; H10H 29/49; G02F 1/133603; F21Y 2109/00; F21V 7/0008
    See application file for complete search history.

(56) References Cited

U.S. PATENT DOCUMENTS

| | | |
|---|---|---|
| 10,145,537 B2 | 12/2018 | Watanabe et al. |
| 11,415,740 B2 | 8/2022 | Choi |
| 11,656,399 B2 | 5/2023 | Choi |
| 11,874,491 B2 | 1/2024 | Choi |
| 11,886,087 B2 | 1/2024 | Yu et al. |
| 12,066,732 B2 | 8/2024 | Yu et al. |
| 12,189,169 B2 | 1/2025 | Choi |
| 2009/0251920 A1 | 10/2009 | Kino et al. |
| 2011/0051411 A1 | 3/2011 | Kim et al. |
| 2014/0022787 A1 | 1/2014 | Park et al. |
| 2014/0268758 A1* | 9/2014 | Morgan ............... H05K 1/0209 362/237 |
| 2015/0219908 A1 | 8/2015 | Lee et al. |
| 2015/0345740 A1 | 12/2015 | Watanabe et al. |
| 2016/0284674 A1* | 9/2016 | Kim ..................... F21V 7/0008 |
| 2016/0293803 A1 | 10/2016 | Kim et al. |
| 2017/0227183 A1* | 8/2017 | Cho ..................... F21S 41/141 |
| 2018/0182940 A1* | 6/2018 | Yamamoto .............. H01L 33/58 |
| 2019/0348582 A1 | 11/2019 | Huang |
| 2023/0273492 A1 | 8/2023 | Yo et al. |
| 2024/0111199 A1 | 4/2024 | Yu et al. |
| 2025/0093571 A1 | 3/2025 | Cho |

FOREIGN PATENT DOCUMENTS

| | | |
|---|---|---|
| EP | 4 198 383 A1 | 6/2023 |
| JP | 2002-150980 A | 5/2002 |
| JP | 2003-242804 A | 8/2003 |
| JP | 2009-248617 A | 10/2009 |
| JP | 2013-503431 A | 1/2013 |
| JP | 2016-181502 A | 10/2016 |
| JP | 2018045907 A * | 3/2018 |
| JP | 2019-197875 A | 11/2019 |
| KR | 20110139039 A * | 12/2011 |
| KR | 10-2015-0092651 A | 8/2015 |
| KR | 10-2016-0117696 A | 10/2016 |
| KR | 10-2020-0007059 A | 1/2020 |
| KR | 10-2020-0080063 A | 7/2020 |

OTHER PUBLICATIONS

Machine translation of JP 2018045907 A retrieved from the FIT database of PE2E search. (Year: 2024).*

* cited by examiner (a)

(b)

(c)

US 12,486,960 B2

LIGHTING DEVICE AND LAMP COMPRISING SAME

CROSS REFERENCE TO RELATED APPLICATIONS

This application is the National Phase of PCT/KR2021/011241 filed on Aug. 24, 2021, which claims priority under 35 U.S.C. § 119(a) to Patent Application No. 10-2020-0106813 filed in the Republic of Korea on Aug. 25, 2020, all of which are hereby expressly incorporated by reference into the present application.

TECHNICAL FIELD

The embodiment relates to a lighting device and a lamp including the same.

BACKGROUND ART

Lighting is used in various fields as a device that may supply light or control the amount of light. For example, the lighting device may be applied to various fields such as vehicles and buildings to illuminate the interior or exterior. In particular, in recent years, a light emitting device has been used as a light source for lighting. Such a light emitting device, for example, a light emitting diode (LED), has advantages such as low power consumption, semi-permanent lifespan, fast response speed, safety, environmental friendliness compared to conventional light sources such as fluorescent lamps and incandescent lamps. Such light emitting diodes are being applied to various optical assemblies such as various display devices, indoor lights, or outdoor lights.

In general, lamps of various colors and shapes are applied to vehicles, and recently, lamps employing light emitting diodes as light sources for vehicles have been proposed. For example, light emitting diodes are being applied to vehicle headlights, tail lights, turn signals, emblems, and the like. However, such a light emitting diode has a problem in that an exit angle of the emitted light is relatively small. For this reason, when the light emitting diode is used as a vehicle lamp, there is a demand for increasing the light emitting area of the lamp. In addition, when the lamp includes the light emitting diode, there is a problem in that a hot spot is formed by the light emitted from the light emitting diode. In this case, when the surface light source is implemented using the lamp, there is a problem in that uniformity characteristics of the light emitting surface are deteriorated.

In addition, in general, when a light emitting diode is applied to a vehicle lamp, there is a problem in that the light emitting diode is visually recognized from the outside. For example, when the vehicle lamp is on, it may not be visible by the light emitted from the light source, but when the lamp is off, the light emitting diode is visible from the outside, resulting in deterioration of the aesthetic and design freedom of the lamp. Therefore, a new lighting device and lamp capable of solving the above problems are required.

DISCLOSURE

Technical Problem

An embodiment provides a lighting device and a lamp having improved luminous intensity. An embodiment provides a lighting device and a lamp capable of realizing a uniform line light source or a surface light source. An embodiment provides a lighting device and a lamp having improved heat dissipation characteristics. An embodiment provides a lighting device and a lamp that have flexibility and can improve design freedom and aesthetics.

Technical Solution

A lighting device according to the embodiment of the invention includes a reflective layer, a resin layer disposed on the reflective layer, a substrate disposed on the resin layer and including an electrode layer, a plurality of light emitting devices disposed between the resin layer and the substrate, and a light blocking layer disposed on the substrate, the electrode layer may include a first pattern region disposed adjacent to the light emitting device and a second pattern region disposed outside the first pattern region and having a size different that of the first pattern region, the light blocking layer may include a plurality of light blocking pattern regions, and the light blocking pattern regions may overlap in a vertical direction with the first pattern region and may have an area greater than an area of the first pattern region.

According to the embodiment of the invention, the light blocking pattern regions may include a plurality of unit light blocking patterns. The area of the light blocking pattern region may be greater within a range of 1.4 times or less than an area of the first pattern region. The light blocking layer may include an optical film spaced apart from the substrate. A portion of the light blocking pattern region may overlap the second pattern region in the vertical direction.

According to the embodiment of the invention, a transparent substrate, a plurality of light emitting devices disposed on a lower surface of the transparent substrate, a reflective layer disposed opposite light emitting surfaces of the plurality of light emitting devices, a resin layer disposed between the transparent substrate and the reflective layer, and a light blocking layer disposed on an upper surface of the transparent substrate, the light blocking layer includes a plurality of light blocking pattern regions, the reflecting layer includes a plurality of reflective pattern regions, and the plurality of light emitting devices may not overlap with the reflective pattern regions and may overlap with the light blocking pattern regions based on a vertical direction.

According to the embodiment of the invention, a portion of the light blocking pattern regions may overlap the reflective pattern region based on the vertical direction. The reflective pattern region may include a plurality of unit reflective patterns. The plurality of unit reflective patterns may have a higher density as a distance from the light emitting device increases. The reflective layer may include a film layer containing white polyethylene terephthalate (PET), and the plurality of unit reflective patterns may be disposed on the film layer.

According to the embodiment of the invention, the light blocking layer may include a light transmitting region through which light emitted through an upper surface of the resin layer passes. An area of the light transmitting region may be greater than areas of the plurality of light blocking pattern regions. The light transmitting region may be disposed between the plurality of light blocking pattern regions.

A lighting device according to the embodiment of the invention includes a reflective layer, a first resin layer disposed on the reflective layer, a transparent substrate disposed on the first resin layer, a plurality of light emitting devices disposed between the first resin layer and the transparent substrate, a light blocking layer disposed on the transparent substrate, a second resin layer disposed between the transparent substrate and the light blocking layer, and a half mirror layer disposed on the light blocking layer, a thickness of the first resin layer may be thicker than that of the second resin layer, the light blocking layer may include a light blocking pattern region including a plurality of unit light blocking patterns, and the plurality of unit light blocking patterns may be spaced apart from each other in row a×column b (a, b are natural numbers greater than or equal to 2), and a unit light blocking pattern disposed in two columns adjacent to each other in the columns b may have the same size.

According to the embodiment of the invention, the plurality of unit light blocking patterns based on a center of the light blocking pattern regions may be arranged symmetrically in a horizontal direction. A size of the unit light blocking pattern disposed in a first column located farthest from the light emitting device in the columns b may be the same as a size of the unit light blocking pattern disposed in a column closest to the center of the light blocking pattern regions. Planar areas of the plurality of unit light blocking patterns may be the same as each other.

According to the embodiment of the invention, a thickness of the half mirror layer may be greater than a thickness of a region overlapping the light emitting device in a vertical direction than a thickness of a region not overlapping the light emitting device. The half mirror layer may have the same color as peripheral regions of the lighting device.

According to an embodiment of the invention, the plurality of light emitting devices may be spaced apart from each other and arranged in row c×column d (c and d are different natural numbers). The first resin layer includes a long axis and a short axis, and at least one of the long axis and the short axis may include a curvature. The lighting device may include a housing with an open upper portion and a receiving space therein, and the reflective layer, the first resin layer, the transparent substrate, the light emitting device, the light blocking layer, the second resin layer, and the half mirror layer may be disposed in the receiving space.

Advantageous Effects

Lighting device and lamp according to the embodiment may have improved light characteristics. In detail, the lighting device and the lamp may minimize the loss of light in the process of emitting light emitted from the light emitting device to the outside of the lighting device by a substrate, a first resin layer, a second resin layer having set thickness. Lighting device and lamp according to embodiments may be provided in various forms as components have a set thickness. In detail, the lighting device may have a straight shape, and at least one of upper, lower and side surfaces may be provided in a curved shape having a curvature. Accordingly, the lighting device may be provided in a straight line or a curved shape on a substrate having various shapes to provide a linear light source or a surface light source with uniform luminance.

In the lighting device and the lamp according to the embodiment, light emitted from the light emitting device may be emitted in an indirect light method in which light emitted from the light emitting device is not directly emitted but reflected to other internal components. Accordingly, it is possible to prevent the light emitting device from being directly viewed from the outside, and to secure a light guiding distance for uniform brightness. In addition, the lighting device and the lamp according to the embodiment may control a hot spot in which light emitted from a light emitting device is concentrated by a light blocking layer. In detail, the light blocking layer may include a light blocking pattern region disposed at a set size and position, and the light blocking pattern region may include a plurality of unit light blocking patterns arranged in a set size, shape, and distance. Accordingly, it is possible to prevent the light emitted from the light emitting device from being concentrated by the light blocking pattern region of the light blocking layer. Accordingly, the lighting device and the lamp according to the embodiment may provide a line light source or a surface light source having uniform luminance of emitted light.

Lighting device and lamp according to the embodiment may have improved heat dissipation characteristics. In detail, the lighting device includes an electrode layer disposed in a set pattern, and the electrode layer may effectively discharge heat emitted from the light emitting device. Therefore, the lighting device and lamp according to the embodiments may have improved reliability and uniform characteristics even when driven for a long time.

The lighting device and the lamp according to the embodiment may have a color set in a state in which the lighting device is turned off, for example, a color identical to or similar to a color of a region around the lighting device and the lamp. In detail, the lighting device and the lamp may include a half mirror layer having the same color as or similar to the color of the peripheral region. Accordingly, it is possible to provide a hidden effect capable of minimizing or preventing the lighting device from being recognized when the device is turned off, and having improved aesthetics and freedom in design.

BEST MODE

Figure 1:
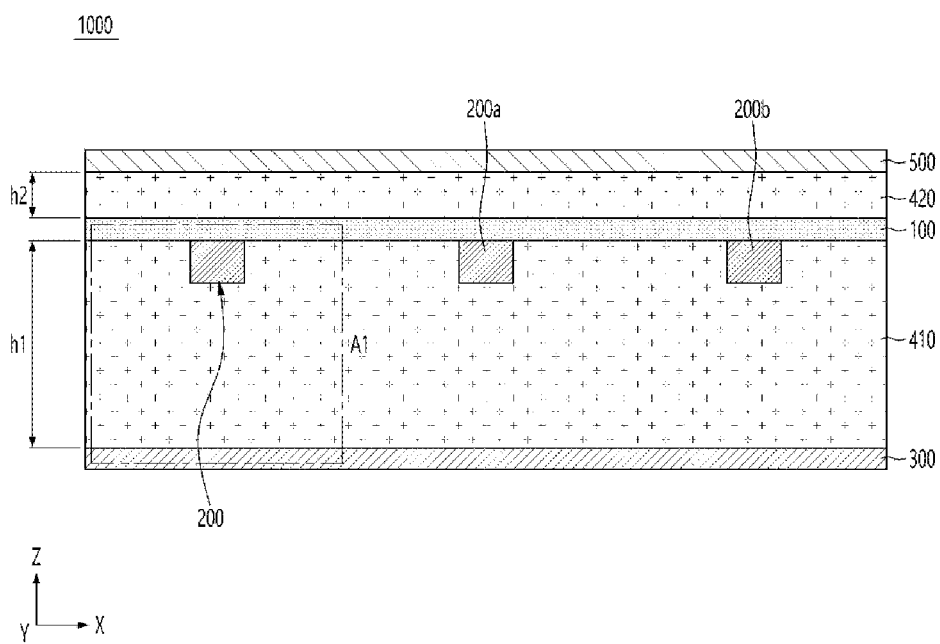
FIG. 1 is a cross-sectional view of a lighting device according to the embodiment.

Hereinafter, preferred embodiments of the invention will be described in detail with reference to the accompanying drawings. The technical idea of the invention is not limited to some of the described embodiments, but can be implemented in various different forms, and if it is within the scope of the technical idea of the invention, one or more of its components may be selectively combined and substituted between embodiments. In addition, terms (including technical and scientific terms) used in the embodiments of the invention, unless explicitly specifically defined and described, may be interpreted as a meaning that may be generally understood by those skilled in the art to which the invention belongs, and terms generally used, such as terms defined in the dictionary, may be interpreted in consideration of the context of the related technology. Also, terms used in the embodiments of the invention are for describing the embodiments and are not intended to limit the invention. In the present specification, the singular form may include a plural form unless specifically described in the phrase, and may include at least one of all combinations that may be combined as A, B, and C when described as "A and/or at least one (or more than one) of B and C". Also, terms such as first, second, A, B, (a), and (b) may be used to describe components of an embodiment of the invention. These terms are intended only to distinguish the components from other components and are not determined by their nature, sequence, or order. Also, when a component is described as being 'connected', 'coupled' or 'connected' to another component, not only when the component is directly connected, coupled or connected to another component, it may also be 'connected', 'coupled', or 'connected' due to another component between that component and the other component. In addition, when each component is described as being formed or disposed "up (above) or down (bottom)", the up (down) or down (bottom) includes not only when two components are in direct contact with each other, but also when one or more components are formed or disposed between two components. Also, when expressed as "up (above) or down (bottom)", it may include the meaning of not only the upward direction but also the downward direction based on one component.

The lighting device according to the invention may be applied to various lamp devices that require lighting, such as vehicle lamps, household optical assemblies, and industrial optical assemblies. For example, when applied to a vehicle lamp, it may be applied to head lamp, side mirror lights, side maker lights, fog lights, tail lights, brake lights, daytime running lights, vehicle interior lights, door scars, rear combination lamps, backup lamps, etc. In addition, when applied to a vehicle lamp, it is applicable to a rear side assistance system (BSD) disposed in a side mirror or a-pillar, etc. Also, the optical assembly of the invention may be applied to indoor and outdoor advertising devices, display devices, and various electric vehicle fields, and in addition to all lighting-related fields or advertising-related fields that are currently developed and commercialized or may be implemented according to technological development in the future, etc. would be applicable.

Before describing an embodiment of the invention, the first direction may refer to an x-axis direction illustrated in the drawing, a second direction may refer to a y-axis direction illustrated in the drawing, and a third direction may refer to a z-axis direction illustrated in the drawing. Also, the horizontal direction may mean first and second directions, and the vertical direction may mean a third direction perpendicular to at least one of the first and second directions. For example, the horizontal direction may refer to the x-axis and y-axis directions of the drawing, and the vertical direction may refer to the z-axis direction of the drawing, perpendicular to the x-axis and y-axis directions.

Figure 2:
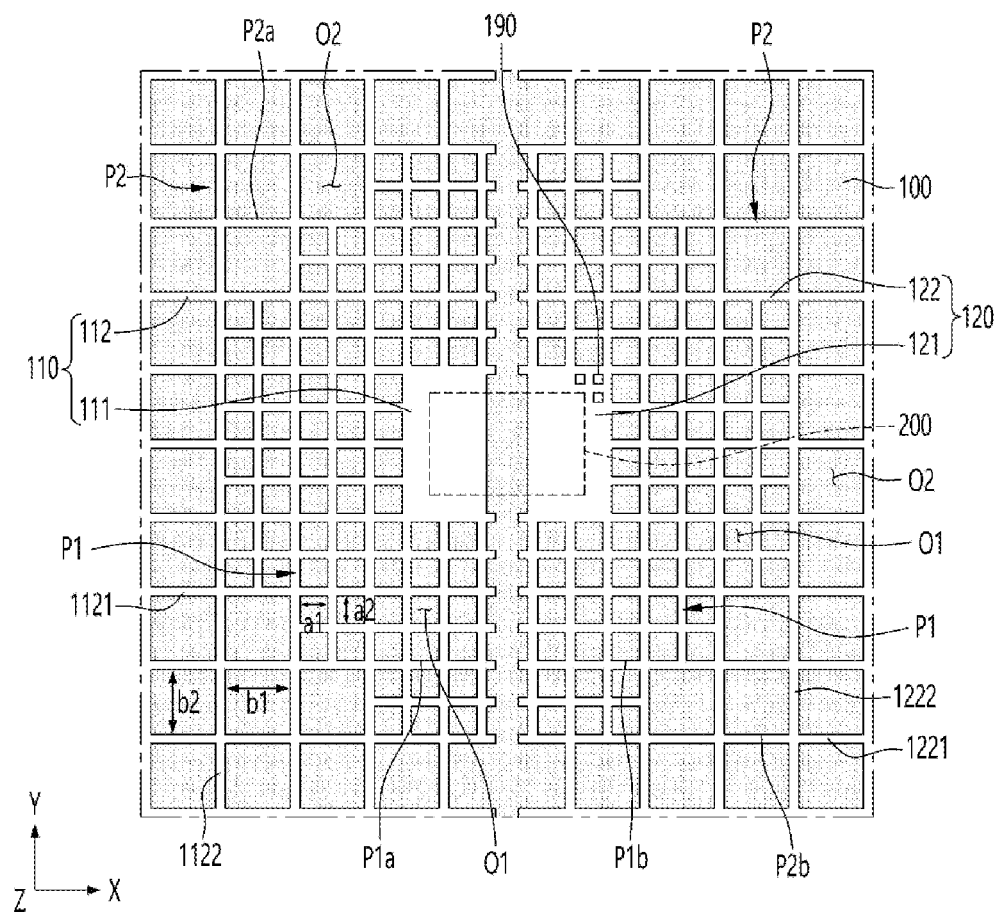
FIG. 2 is a plan view illustrating an electrode layer according to the embodiment.
Figure 3:
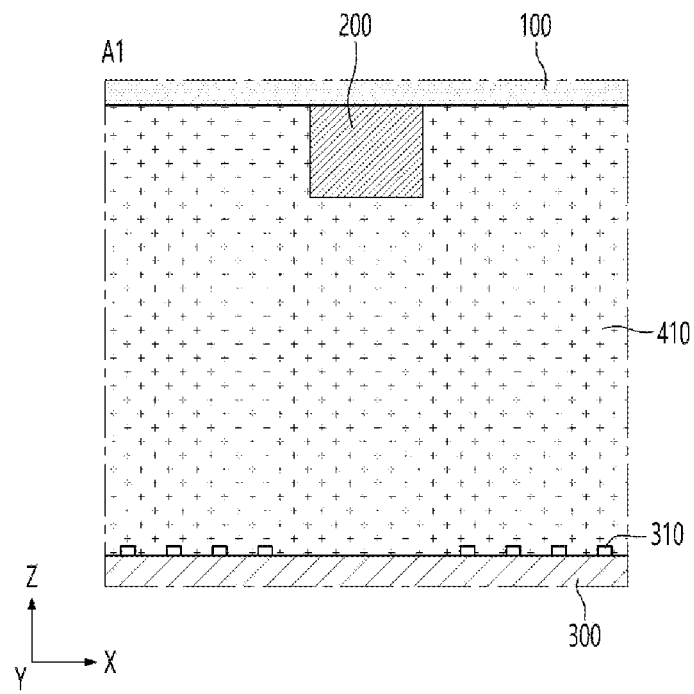
FIG. 3 is an enlarged view of region A1 of FIG. 1.
Figure 4:
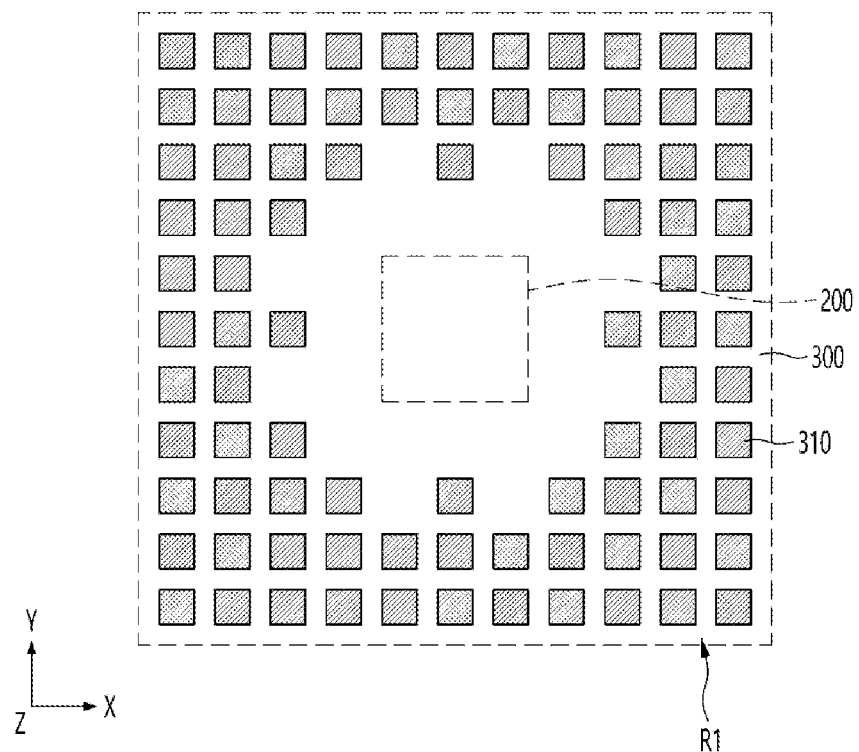
FIG. 4 is a plan view of a reflective layer according to the embodiment.
Figure 5:
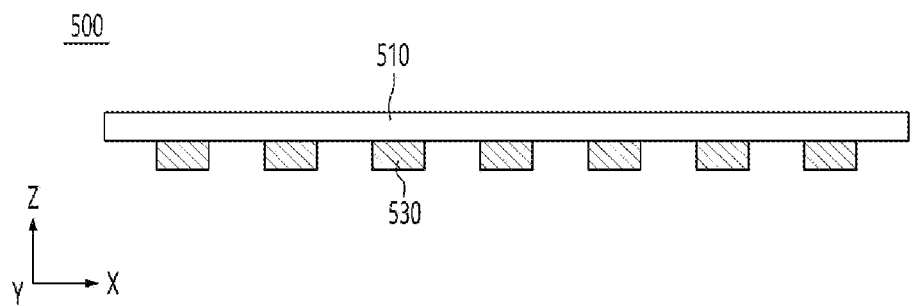
FIG. 5 is a cross-sectional view of a light blocking layer according to the embodiment.
Figure 6:
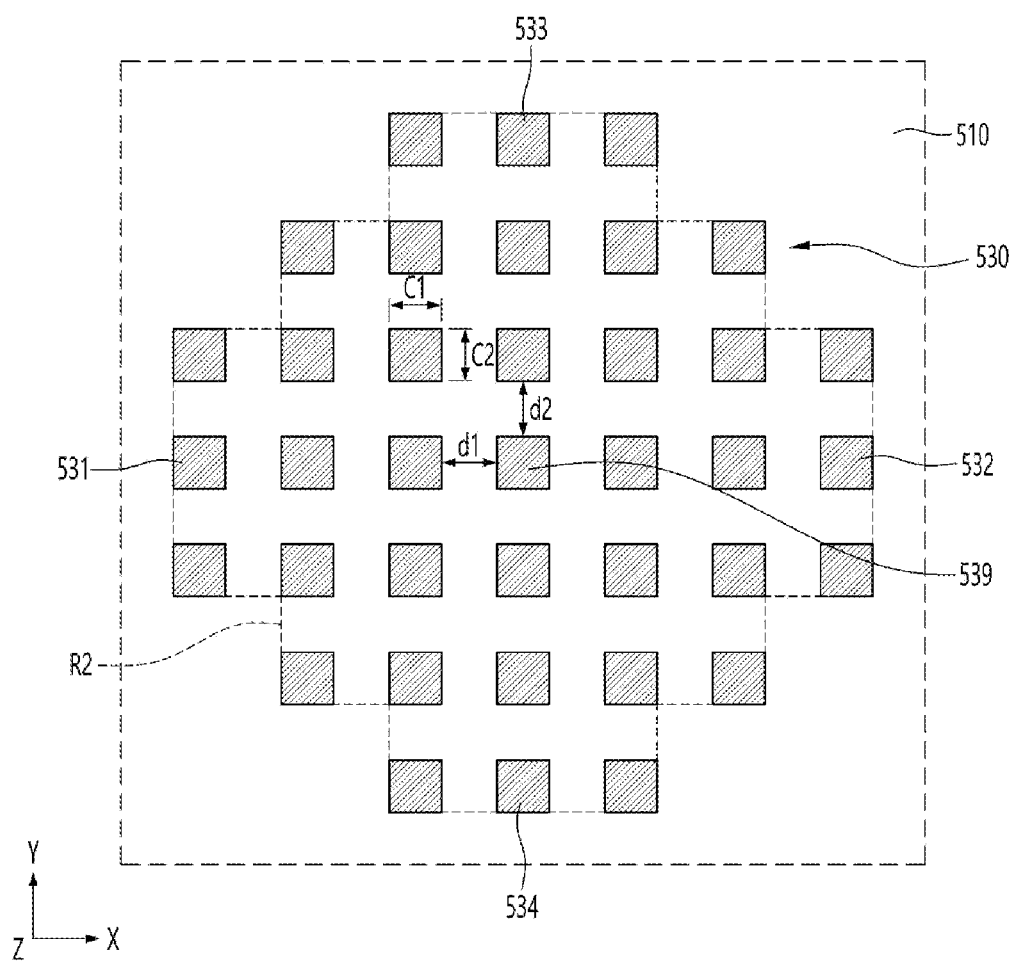
FIG. 6 is a plan view of a light blocking layer according to the embodiment.

FIG. 1 is a cross-sectional view of a lighting device according to the embodiment, and FIG. 2 is a plan view illustrating an electrode layer according to an embodiment. FIG. 3 is an enlarged view of region A1 of FIG. 1, and FIG. 4 is a plan view of a reflective layer according to the embodiment. In addition to, FIG. 5 is a cross-sectional view of a light blocking layer according to the embodiment, and FIG. 6 is a plan view of the light blocking layer according to the embodiment.

Referring to FIGS. 1 to 6, the lighting device 1000 according to the embodiment may include a substrate 100, a light emitting device 200, a reflective layer 300, a first resin layer 410, a second resin layer 420, and a light blocking layer 500. The lighting device 1000 may emit light emitted from the light emitting device 200 to a surface light source. The lighting device 1000 may emit light emitted from the light emitting device 200 as a surface light source. The lighting device 1000 may be defined as a light emitting cell, a lighting module, or a light source module. The lighting device 1000 may include one light emitting cell or a plurality of light emitting cells on the substrate 100.

The substrate 100 may include a light-transmissive material. The substrate 100 may include a material through which light is transmitted through upper and lower surfaces. The substrate 100 may be a transparent substrate. The substrate 100 may include at least one of PET (Polyethylene terephthalate), PS (Polystyrene), PI (Polyimide), PEN (Polyethylene naphthalate), and PC (Poly carbonate). The substrate 100 may have a thickness of about 30 μm to about 300 μm. When the substrate 100 is less than about 30 μm thick, it may be difficult to effectively support the light emitting device 200 on the substrate 100, for example, the weight of the light emitting device 200 may cause a region of the substrate 100 on which the light emitting device 200 is disposed. Accordingly, the reliability of the substrate 100 may deteriorate, and an alignment problem of the light emitting device 200 disposed on the substrate 100 may occur. In addition, when the thickness of the substrate 100 exceeds about 300 μm, the total thickness of the lighting device 1000 may increase and the flexibility of the substrate 100 may decrease. In addition, when the thickness of the substrate 100 exceeds about 300 μm, a path of light emitted by the thickness of the substrate 100 may change, and as a result, it may be difficult to implement a uniform surface light source.

Electrode layers 110 and 120 may be disposed on the substrate 100. The electrode layers 110 and 120 may be disposed on the lower surface of the substrate 100. In detail, the electrode layers 110 and 120 may be disposed on the lower surface of the substrate 100 facing the first resin layer 410. The electrode layers 110 and 120 may include a first electrode 110 and a second electrode 120. The first electrode 110 and the second electrode 120 may be spaced apart from each other on the lower surface of the substrate 100. For example, the first electrode 110 and the second electrode 120 may be spaced apart in a first direction with respect to the light emitting device 200. Accordingly, the first electrode 110 and the second electrode 120 may be electrically separated from each other. The first electrode 110 and the second electrode 120 may include a conductive material. For example, the first electrode 110 and the second electrode 120 may include at least one of aluminum (Al), copper (Cu), silver (Ag), gold (Au), chromium (Cr), nickel (Ni), molybdenum (Mo), titanium (Ti), and alloys thereof, carbon, and a conductive polymer. In addition, the first electrode 110 and the second electrode 120 may include at least one of transparent conductive materials, such as ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). The first electrode 110 and the second electrode 120 may provide current to the light emitting device 200. For example, the first electrode 110 may provide a current with a first polarity to the light emitting device 200, and the second electrode 120 may provide a current with a second polarity opposite to the first polarity to the light emitting device 200.

The first electrode 110 may include a first pad 111 and a first electrode pattern 112. The first pad 111 may be disposed in a region corresponding to the light emitting device 200. For example, the first pad 111 may be disposed in a region corresponding to a first bonding portion (not shown) of the light emitting device 200. The first electrode pattern 112 may be disposed around the first pad 111. The first electrode pattern 112 may be connected to the first pad 111. The first electrode pattern 112 may be electrically connected to the first bonding portion of the light emitting device 200. The first electrode pattern 112 may include a plurality of first sub-wires 1121 and a plurality of second sub-wires 1122 extending in different directions. The plurality of first sub-wires 1121 may extend in the first direction. Also, the plurality of first sub-wires 1121 may be spaced apart from each other in the second direction perpendicular to the first direction. Also, the plurality of second sub-wires 1122 may extend in the second direction. Also, the plurality of second sub-wires 1122 may be spaced apart from each other in the first direction. The first electrode pattern 112 may have a mesh shape in which the first sub-wires 1121 and the second sub-wires 1122 cross each other. The first electrode pattern 112 may have a set line width. For example, the line width of the first electrode pattern 112 may be about 80 µm or less. In detail, the line width of the first electrode pattern 112 may be about 60 µm or less. In more detail, the line width of the first electrode pattern 112 may be about 35 µm or less. Line widths of the plurality of first sub-wires 1121 may be the same within the line width range described above. Line widths of the plurality of second sub-wires 1122 may be the same within the line width range described above. Also, the line widths of the first sub-wire 1121 and the second sub-wire 1122 may be the same.

The second electrode 120 may include a second pad 121 and a second electrode pattern 122. The second pad 121 may be spaced apart from the first pad 111 and the first electrode pattern 112 and disposed in a region corresponding to the light emitting device 200. For example, the second pad 121 may be disposed in a region corresponding to a second bonding portion (not shown) of the light emitting device 200. The second electrode pattern 122 may be disposed around the second pad 121. The second electrode pattern 122 may be spaced apart from the first pad 111 and the first electrode pattern 112 and connected to the second pad 121. The second electrode pattern 122 may be electrically connected to the second bonding portion of the light emitting device 200. The second electrode pattern 122 may include a plurality of third sub-wires 1221 and a plurality of fourth sub-wires 1222 extending in different directions. The plurality of third sub-wires 1221 may extend in the first direction. Also, the plurality of third sub-wires 1221 may be spaced apart from each other in the second direction perpendicular to the first direction. Also, the plurality of fourth sub-wires 1222 may extend in the second direction. Also, the plurality of fourth sub-wires 1222 may be spaced apart from each other in the first direction. The second electrode pattern 122 may have a mesh shape in which the third sub-wire 1221 and the fourth sub-wire 1222 cross each other.

The second electrode pattern 122 may have a set line width. The second electrode pattern 122 may have the same line width as the first electrode pattern 112. For example, the line width of the second electrode pattern 122 may be about 80 µm or less. In detail, the line width of the second electrode pattern 122 may be about 60 µm or less. In more detail, the line width of the second electrode pattern 122 may be about 35 µm or less. The line widths of the plurality of third sub-wires 1221 may be the same within the range described above. The line widths of the plurality of fourth sub-wires 1222 may be the same within the range described above. Also, the line widths of the third sub-wire 1221 and the fourth sub-wire 1222 may be the same as each other. The line widths of the first to fourth sub-wires 1222 may be the same as each other.

The electrode layers 110 and 120 may include a plurality of pattern regions. For example, each of the first electrode 110 and the second electrode 120 may include a first pattern region P1 and a second pattern region P2. The first pattern region P1 and the second pattern region P2 may have the same line width. The first pattern region P1 may include a 1-1 pattern region P1a of the first electrode 110 and a 1-2 pattern region P1b of the second electrode 120.

The 1-1 pattern region P1a may be a region disposed adjacent to the light emitting device 200. The 1-1 pattern region P1a is a region formed by the intersection of the first sub-wire 1121 and the second sub-wire 1122 and may be disposed around the first pad 111. The 1-1 pattern region P1a may be physically and electrically connected to the first pad 111. The 1-1 pattern region P1a may be electrically connected to the first bonding portion of the light emitting device 200. The 1-2 pattern region P1b may be a region disposed adjacent to the light emitting device 200. The 1-2 pattern region P1b may be spaced apart from the 1-1 pattern region P1a. The 1-2 pattern region P1b is a region formed by the intersection of the third sub-wire 1221 and the fourth sub-wire 1222 and may be disposed around the second pad 121. The 1-2 pattern region P1b may be physically and electrically connected to the second pad 121. The 1-2 pattern region P1b may be electrically connected to the second bonding portion of the light emitting device 200.

Each of the 1-1 pattern region P1a and the 1-2 pattern region P1b may include a plurality of first unit patterns having a first opening region O1. In this case, the first unit pattern of the 1-1 pattern region P1a may have the same shape as the first unit pattern of the 1-2 pattern region P1b. In addition, the first unit pattern of the 1-1 pattern region P1a and the first unit pattern of the 1-2 pattern region P1b may have the same size as each other. That is, the first opening region O1 of the 1-1 pattern region P1a may have the same shape and size as the first opening region O1 of the 1-2 pattern region P1b. The first unit pattern may have a mesh shape. Each of the first unit patterns of the 1-1 pattern region P1a and the 1-2 pattern region P1b may have a set horizontal width a1 and vertical width a2. For example, each of the horizontal width a1 and the vertical width a2 of the first unit pattern may be about 250 µm or less. Each of the horizontal width a1 and the vertical width a2 of the first unit pattern may be about 200 µm or less. In this case, the first unit pattern may have the same horizontal width a1 and vertical width a2. That is, the first unit patterns of the 1-1 pattern region P1a and the 1-2 pattern region P1b may have a square shape.

On the substrate 100, the 1-1 pattern region P1a may be disposed symmetrically with the 1-2 pattern region P1b. In detail, the 1-1 pattern region P1a and the 1-2 pattern region P1b may be symmetrical to each other with respect to the light emitting device 200. That is, the number of the first opening region O1 included in the 1-1 pattern region P1*a* may be the same as the number of the first opening region O1 included in the 1-2 pattern region P1*b*. In addition, an area occupied by the 1-1 pattern region P1*a* with respect to the light emitting device 200 may be the same as an area occupied by the 1-2 pattern region P1*b*.

The second pattern region P2 may be disposed outside the first pattern region P1. The second pattern region P2 may include a 2-1 pattern region P2*a* of the first electrode 110 and a 2-2 pattern region P2*b* of the second electrode 120. The 2-1 pattern region P2*a* may be a region spaced apart from the light emitting device 200. The 2-1 pattern region P2*a* may be disposed around the 1-1 pattern region P1*a* as a region formed by crossing the first sub-wire 1121 and the second sub-wire 1122. The 2-1 pattern region P2*a* may be physically and electrically connected to the 1-1 pattern region P1*a*. The 2-1 pattern region P2*a* may be electrically connected to the first bonding portion of the light emitting device 200.

The 2-2 pattern region P2*b* may be a region spaced apart from the light emitting device 200. The 2-2 pattern region P2*b* may be spaced apart from the 2-1 pattern region P2*a*. The 2-2 pattern region P2*b* may be disposed around the 1-2 pattern region P1*b* as a region formed by crossing the third sub-wire 1221 and the fourth sub-wire 1222. The 2-2 pattern region P2*b* may be physically and electrically connected to the 1-2 pattern region P1*b*. The 2-2 pattern region P2*b* may be electrically connected to the second bonding portion of the light emitting device 200. Each of the 2-1 pattern region P2*a* and the 2-2 pattern region P2*b* may include a plurality of second unit patterns having a second opening region O2. In this case, the second unit pattern of the 2-1 pattern region P2*a* may have the same shape as the second unit pattern of the 2-2 pattern region P2*b*. Also, the second unit pattern of the 2-1 pattern region P2*a* may have the same size as the second unit pattern of the 2-2 pattern region P2*b*. That is, the second opening region O2 of the 2-1 pattern region P2*a* may be provided in the same shape and size as the second opening region O2 of the 2-2 pattern region P2*b*. The second unit pattern may have a mesh shape.

Each of the second unit patterns of the 2-1 pattern region P2*a* and the 2-2 pattern region P2*b* may have a set horizontal width b1 and vertical width b2. For example, each of the horizontal width b1 and the vertical width b2 of the second unit pattern may be about 450 μm or less. In detail, each of the horizontal width b1 and the vertical width b2 of the second unit pattern may be about 400 μm or less. In this case, the second unit pattern may have the same horizontal width b1 and vertical width b2. That is, the second unit patterns of the 2-1 pattern region P2*a* and the 2-2 pattern region P2*b* may have a square shape. On the substrate 100, the 2-1 pattern region P2*a* may be disposed symmetrically with the 2-2 pattern region P2*b*. In detail, the 2-1 pattern region P2*a* and the 2-2 pattern region P2*b* may be symmetrical to each other with respect to the light emitting device 200. That is, the number of the second opening region O2 included in the 2-1 pattern region P2*a* may be the same as the number of the second opening region O2 included in the 2-2 pattern region P2*b*. Also, an area occupied by the 2-1 pattern region P2*a* based on the light emitting device 200 may be the same as an area occupied by the 2-2 pattern region P2*b*.

At this time, in the lighting device 1000 according to the embodiment, the size of the second unit pattern of the second pattern region P2 may be different from the size of the first unit pattern of the first pattern region P1. For example, the size of the second unit pattern may be greater than the size of the first unit pattern. In detail, the horizontal width b1 and vertical width b2 of the second unit pattern may be greater than the horizontal width a1 and vertical width a2 of the first unit pattern. Accordingly, the width (horizontal or vertical width) of the second opening region O2 may be greater than the width (horizontal or vertical width) of the first opening region O1.

The first pattern region P1 of the electrode layers 110 and 120 may have a set shape. For example, when the first pattern region P1 is viewed from the top, the first pattern region P1 of the first electrode 110 and the second electrode 120 may have a circular, elliptical, or polygonal shape, or a shape close to the above-mentioned shape. In detail, the first pattern region P1 may have a circular, elliptical, or polygonal shape centered on the optical axis of the light emitting device 200, or may have a shape close to the above-mentioned shape. For example, the first pattern region P1 may have a shape corresponding to a hot spot formed by the light emitting device 200. That is, the first pattern region P1 formed by the plurality of first unit patterns may have a shape close to a circle.

Also, the first pattern region P1 may have a set area. For example, the area occupied by the first pattern region P1 including the plurality of first unit patterns in the electrode layers 110 and 120 may have an area corresponding to an area formed by the light emitting device 200. An area occupied by the first pattern region P1 in the electrode layers 110 and 120 may be greater than that of the light emitting device 200. For example, the area occupied by the first pattern region P1 may be about 5 times to about 15 times the area of the light emitting device 200. In detail, the area occupied by the first pattern region P1 may be about 5 to about 15 times the area of the lower surface of the light emitting device 200 in contact with the substrate 100. In more detail, the area occupied by the first pattern region P1 may be about 5 to about 10 times the area of the lower surface of the light emitting device 200.

When the area occupied by the first pattern region P1 is less than about 5 times the area of the lower surface of the light emitting device 200, it may be difficult to effectively prevent the formation of hot spots of the light emitting device 200. That is, since the area of the first pattern region P1 is too small, a hot spot may be formed in a region outside the periphery of the first pattern region P1. In addition, when the area occupied by the first pattern region P1 exceeds about 15 times the area of the lower surface of the light emitting device 200, the hot spot of the light emitting device 200 may be prevented, but the area occupied by the first pattern region P1 may be too large to reduce the amount of light emitted through the opening region of the electrode layers 110 and 120. Accordingly, there is a problem in that overall luminance of the lighting device 1000 is lowered. Therefore, it is preferable that the area occupied by the first pattern region P1 in the electrode layers 110 and 120 satisfies the range described above with respect to the area of the light emitting device 200. The lighting device 1000 according to the embodiment may have improved light emission efficiency, emit uniform light, and may effectively discharge heat emitted from the light emitting device 200 as the electrode layers 110 and 120 include a plurality of pattern regions P1 and P2.

The light emitting device 200 may be disposed on the substrate 100. For example, the light emitting device 200 may be disposed on the lower surface of the substrate 100. The light emitting device 200 may be disposed facing the reflective layer 300 to be described later. The light emitting device 200 is an LED chip that emits light on at least five sides, and may be disposed on the substrate 100 in a flip chip form. Alternatively, the light emitting device 200 may be a horizontal chip or a vertical chip. In the horizontal chip, two different electrodes may be disposed in a horizontal direction, and in the vertical chip, two different electrodes may be disposed in a vertical direction. Since the light emitting device 200 is connected to another chip or wiring pattern by a wire in the case of the horizontal chip or the vertical chip, the thickness of the module may increase due to the height of the wire and a pad space for bonding the wire may be required.

In addition, the light emitting device 200 may include a package in which an LED chip is packaged. The LED chip may emit at least one of blue, red, green, ultraviolet (UV), and infrared light, and the light emitting device 200 may emit at least one of white, blue, red, green, and infrared light. The light emitting device 200 may be a top view type in which a bottom portion is electrically connected to the substrate 100. An optical axis of the light emitting device 200 may be perpendicular to the lower surface of the substrate 100. The light emitting device 200 may be electrically connected to the electrode layers 110 and 120. For example, the light emitting device 200 may be electrically connected to the first electrode 110 and the second electrode 120 on the substrate 100 by a conductive bonding member (not shown) with the substrate 100. The conductive bonding member may be a solder material or a metal material.

A plurality of light emitting devices 200 may be disposed on the substrate 100. For example, a plurality of light emitting devices 200 spaced apart in a first direction (x-axis direction) may be disposed on the substrate 100. In addition, a plurality of light emitting devices 200 spaced apart in a second direction (y-axis direction) may be disposed on the substrate 100. For example, when viewed from a plane, the plurality of light emitting devices 200 may be arranged in row c×column d (c and d are natural numbers that are the same or different). The light emitting device 200 may include a light emitting surface from which light is emitted. The light emitting surface of the light emitting device 200 may face an upper surface of the reflective layer 300. The light emitting surface may be parallel to the upper surface of the reflective layer 300. The light emitting surface of the light emitting device 200 may emit light with the highest intensity in the third direction (z-axis direction), for example, toward the upper surface of the reflective layer 300. The light emitting surface may be a vertical plane or include a concave or convex surface.

The light emitting device 200 may emit light toward the reflective layer 300. For example, light emitted through the light emitting surface of the light emitting device 200 may be provided to the reflective layer 300. The light provided to the reflective layer 300 may be reflected by the reflective layer 300 and emitted toward the substrate 100, and the light passing through the substrate 100 may have a form of a line light source or a surface light source. That is, the lighting device 1000 may be an indirect lighting device. Accordingly, it is possible to prevent the light emitting device 200 from being visually recognized from the outside. In this case, the optical axis of the light emitting device 200 may be perpendicular to the lower surface of the substrate 100. Also, an optical axis of the light emitting device 200 may be perpendicular to the upper surface of the reflective layer 300.

The reflective layer 300 may be disposed on the substrate 100. In detail, the reflective layer 300 may be disposed on the lower surface of the substrate 100. The reflective layer 300 may be disposed lower than the lower surface of the substrate 100 and the light emitting device 200. The reflective layer 300 is spaced apart from the substrate 100 and the light emitting device 200 and may be disposed to face a light emitting surface of the light emitting device 200. The reflective layer 300 may have an area greater than or equal to that of the lower surface of the substrate 100.

The reflective layer 300 may include a film layer (not shown). The film layer may be provided in the form of a film having a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polychloride biphenyl, polyethylene terephthalate, polyvinyl alcohol, polycarbonate, polybutylene terephthalate, polyethylene naphthalate, polyamide, polyacetal, polyphenylene ether, polyamide, polyetherimide, polyether ether ketone, polyimide, polytetrafluoroethylene, liquid crystal polymer, fluorine resin, and a mixture thereof. As the resin material, a reflective material such as $TiO_2$, $Al_2O_3$, or $SiO_2$ may be added to silicon or epoxy. The film layer may be implemented as a single layer or multiple layers, and light reflection efficiency may be improved by such a layer structure. In addition, the film layer may be provided in a color. In detail, the film layer may be provided in a color having low light absorption and excellent light reflection properties. For example, the film layer may be provided in white with excellent light reflection properties. In detail, the film layer may be formed of white polyethylene naphthalate.

The reflective layer 300 may include a plurality of reflective pattern regions R1. The plurality of reflective pattern regions R1 may be disposed in regions that do not correspond to the light emitting device 200. In detail, the reflective pattern region R1 may be disposed in a region that does not overlap with the light emitting device 200 in the vertical direction (third direction, z-axis direction). When viewed from above, each of the plurality of reflective pattern regions R1 may have various shapes. For example, the upper shape of the reflective pattern region R1 may have a circular shape, an elliptical shape, a polygonal shape, or a shape close to the above-mentioned shape. In this case, the reflective pattern region R1 may be provided in a donut shape that is not disposed in a region corresponding to the light emitting device 200 in the vertical direction. In addition, the reflective pattern region R1 may be formed on the entire remaining region of the reflective layer 300 except for the region corresponding to the light emitting device 200.

The reflective pattern region R1 may include a plurality of unit reflective patterns 310. The reflective pattern region R1 may mean a region where a plurality of unit reflective patterns 310 are disposed. The plurality of unit reflective patterns 310 may have a dot shape. The plurality of unit reflective patterns 310 may be disposed on a lower surface of the substrate 100 and an upper surface of the reflective layer 300 facing the light emitting device 200. In detail, the unit reflective pattern 310 may be disposed on an upper surface of a film layer facing the light emitting device 200. The plurality of unit reflective patterns 310 may be disposed on the upper surface of the reflective layer 300, for example, in a protruding form on the upper surface of the film layer. For example, the unit reflective pattern 310 may be disposed on the upper surface of the reflective layer 300 in a form protruding toward the light emitting device 200.

The plurality of unit reflective patterns 310 may be spaced apart from each other in the first and second directions, and may be disposed in a region that does not correspond to the light emitting device 200. In detail, the plurality of unit reflective patterns 310 may be disposed in a region that does not overlap with the light emitting device 200 in the vertical direction (third direction, z-axis direction). Also, the plurality of unit reflective patterns 310 may be disposed in a region overlapping the electrode layers 110 and 120 in the vertical direction. For example, the plurality of unit reflective patterns 310 may be disposed in a region vertically overlapping the first pattern region P1 of the electrode layers 110 and 120. In detail, the plurality of unit reflective patterns 310 may be overlapped with the first and second pattern regions P1 and P2 of the electrode layers 110 and 120 in the vertical direction.

The plurality of unit reflective patterns 310 may be formed through a printing process. For example, the plurality of unit reflective patterns 310 may include reflective ink. The plurality of unit reflective patterns 310 may be printed with a material including any one of $TiO_2$, $CaCO_3$, $BaSO_4$, $Al_2O_3$, Silicon, and PS. The material of the unit reflective pattern 310 may be white with excellent reflective properties. When viewed from above, the plurality of unit reflective patterns 310 may have various shapes such as circular, elliptical, and polygonal shapes. In addition, each of the plurality of unit reflective patterns 310 may have a hemispherical cross section or a polygonal shape.

The pattern density of the plurality of unit reflective patterns 310 may change as the distance from the region corresponding to the light emitting device 200 increases. For example, the density of the plurality of unit reflective patterns 310 may increase as the distance from an overlapping region vertically overlapping the light emitting device 200 on the upper surface of the reflective layer 300 increases. That is, the density of the plurality of unit reflective patterns 310 may increase as the distance from the optical axis of the light emitting device 200 in the horizontal direction increases. Also, the size of each of the plurality of unit reflective patterns 310 may increase or may be the same as the distance from the overlapping region increases. For example, a horizontal width of each of the plurality of unit reflective patterns 310 may increase as the distance from the overlapping region increases. That is, as the plurality of unit reflective patterns 310 are disposed on the upper surface of the reflective layer 300 that does not overlap the light emitting device 200, the reflective layer 300 may improve the reflectance of light emitted from the light emitting device 200. Accordingly, the lighting device 1000 may reduce the loss of light emitted to the outside through the open region of the substrate 100 and improve the luminance of the surface light source.

The reflective layer 300 may have a thickness of about 50 μm to about 500 μm. When the thickness of the reflective layer 300 is less than about 50 μm, light reflection characteristics of the reflective layer 300 may be deteriorated and reliability of the lighting device 1000 may be deteriorated. In addition, when the thickness of the reflective layer 300 exceeds about 500 μm, the overall thickness of the lighting device 1000 may increase, and as a result, the flexibility of the lighting device 1000 may decrease. Preferably, the thickness of the reflective layer 300 may be about 80 μm to about 350 μm in consideration of reliability, light reflection characteristics, and the like. Accordingly, the reflective layer 300 may effectively reflect incident light so that the light is emitted in a uniform distribution, and may increase the total amount of light of the lighting device 1000.

The first resin layer 410 may be disposed on the substrate 100. The first resin layer 410 may be disposed on the lower surface of the substrate 100. The first resin layer 410 may be disposed s the substrate 100 and the reflective layer 300. The first resin layer 410 may be disposed between the lower surface of the substrate 100 and the upper surface of the reflective layer 300. The first resin layer 410 may be disposed on the total or part of the lower surface of the substrate 100.

The first resin layer 410 may be formed of a transparent material. The first resin layer 410 may include a resin material such as silicone or epoxy. The first resin layer 410 may include a thermosetting resin material, such as PC, OPS, PMMA, or PVC selectively. The first resin layer 410 may be made of glass, but is not limited thereto. For example, a resin material containing urethane acrylate oligomer as a main material may be used as the main material of the first resin layer 410. For example, a mixture of synthetic oligomer, urethane acrylate oligomer, and polyacrylic polymer type may be used. Of course, a monomer in which IBOA (isobornyl acrylate), HPA (Hydroxypropyl acrylate, 2-HEA (2-hydroxyethyl acrylate) and the like, which are low-boiling dilute reactive monomers, may be further included, and a photoinitiator (e.g., 1-hydroxycyclohexyl phenyl-ketone) or an antioxidant may be mixed as an additive. The first resin layer 410 may emit a point light source emitted from the light emitting device 200 in the form of a line light source or a surface light surface.

The upper surface of the first resin layer 410 may emit light by diffusing light emitted from the light emitting device 200. For example, a bead (not shown) may be included in the first resin layer 410, and the bead diffuses and reflects incident light to increase the amount of light. The beads may be disposed in a range of 0.01 to 0.3% of the weight of the first resin layer 410. The bead may be formed of any one selected from silicon, silica, glass bubble, PMMA (Polymethyl methacrylate), urethane, Zn, Zr, $Al_2O_3$, and acryl, and the particle diameter of the bead may be in the range of about 1 μm to about 20 μm, but is not limited thereto.

The first resin layer 410 may have a thickness greater than that of the light emitting device 200. For example, the first resin layer 410 may have a thickness of about 5 mm or less. In detail, the first resin layer 410 may have a thickness of about 0.5 mm to about 4 mm. When the thickness h1 of the first resin layer 410 is less than about 0.5 mm, it may be difficult to effectively guide light to be emitted from the light emitting device 200. That is, since the distance between the light emitting device 200 and the reflective layer 300 is too small, it may be difficult for the lighting device 1000 to implement a surface light surface. Also, when the thickness h1 of the first resin layer 410 exceeds about 4 mm, the entire light path may increase. Accordingly, light loss may occur during the process of emitting light emitted from the light emitting device 200. Accordingly, it is preferable that the thickness h1 of the first resin layer 410 satisfies the above-mentioned range. The first resin layer 410 may be disposed while surrounding the light emitting device 200. The first resin layer 410 may seal the light emitting device 200. The first resin layer 410 may protect the light emitting device 200 and reduce loss of light emitted from the light emitting device 200.

The first resin layer 410 may contact the surface of the light emitting device 200 and may contact the light emitting surface of the light emitting device 200. Also, the first resin layer 410 may contact the lower surface of the substrate 100 and the upper surface of the reflective layer 300. That is, the first resin layer 410 may support the substrate 100, the light emitting device 200, and the reflective layer 300, and the components 100, 200, and 300 may maintain a set distance and a set maintenance.

The second resin layer 420 may be disposed on the substrate 100. The second resin layer 420 may be disposed on an upper surface of the substrate 100 opposite to a lower surface of the substrate 100 on which the first resin layer 410 is disposed. The second resin layer 420 may be disposed on the entire upper surface or a partial region of the substrate 100. The second resin layer 420 may be formed of a transparent material. The second resin layer 420 may include a resin material such as silicone or epoxy. The second resin layer 420 may include a thermosetting resin material, such as PC, OPS, PMMA, or PVC selectively. As another example, the second resin layer 420 may be made of glass. For example, a resin material containing urethane acrylate oligomer as a main material may be used as the main material of the second resin layer 420. For example, a mixture of a synthetic oligomer, urethane acrylate oligomer, and a polyacrylic polymer type may be used. Of course, a monomer in which IBOA (isobornyl acrylate), HPA (Hydroxypropyl acrylate), 2-HEA (2-hydroxyethyl acrylate), and the like, which are low-boiling dilute reactive monomers, may be further included, and a photoinitiator (e.g., 1-hydroxycyclohexyl phenyl-ketone) or an antioxidant may be mixed as an additive. The second resin layer 420 may include the same material as the first resin layer 410.

The second resin layer 420 may serve as a light guiding layer. For example, the second resin layer 420 may guide light incident through the substrate 100. In detail, the second resin layer 420 may further diffuse light that is reflected from the reflective layer 300 and passes through the first resin layer 410 and the substrate 100. For example, a bead (not shown) may be included in the second resin layer 420, and the bead diffuses and reflects incident light to increase the amount of light. The beads may be disposed in a range of 0.01 to 0.3% of the weight of the second resin layer 420. The bead may be formed of any one selected from silicon, silica, glass bubble, PMMA (Polymethyl methacrylate), urethane, Zn, Zr, $Al_2O_3$, and acryl, and the particle diameter of the bead may be in the range of about 1 μm to about 20 μm, but is not limited thereto. For example, the second resin layer 420 may be provided as an adhesive layer that bonds the substrate 100 disposed under the second resin layer 420 and two components disposed thereon.

The second resin layer 420 may have a set thickness h2. For example, the thickness h2 of the second resin layer 420 may be about 2 mm or less. In detail, the thickness h2 of the second resin layer 420 may be about 50 μm to about 1.5 mm. When the thickness h2 of the second resin layer 420 is less than about 50 μm, it may be difficult to perform a function of an adhesive layer that adheres between the substrate 100 and a component disposed thereon, and it may be difficult to effectively guide light incident on the second resin layer 420. That is, since the thickness h2 of the second resin layer 420 is relatively thin, a space for guiding light emitted through the substrate 100 may be insufficient. In addition, when the lighting device 1000 is bent in a third direction by an external force, such as a wave, the thickness h2 of the second resin layer 420 may be too thin to effectively guide light emitted through the substrate 100 and the first resin layer 410. Also, when the thickness h2 of the second resin layer 420 exceeds about 1.5 mm, the luminance uniformity characteristic of the light emitted through the second resin layer 420 may deteriorate. In addition, when the thickness h2 of the second resin layer 420 exceeds about 1.5 mm, the total thickness of the lighting device 1000 may increase, and the degree of freedom of design may decrease, and light loss may occur due to the thickness h2 of the second resin layer 420. Therefore, it is preferable that the thickness h2 of the second resin layer 420 satisfies the above-mentioned range.

The thickness h2 of the second resin layer 420 may be different from the thickness h1 of the first resin layer 410. For example, the thickness h2 of the second resin layer 420 may be smaller than the thickness h1 of the first resin layer 410. For example, the thickness h2 of the second resin layer 420 may be about 0.03% to about 95% of the thickness h1 of the first resin layer 410. Accordingly, the lighting device 1000 according to the embodiment may emit light with a surface light source having excellent uniformity. That is, as the first and second resin layers 410 and 420 satisfy the above-mentioned thickness range, uniformity of light emitted through the upper surface of the second resin layer 420 may be excellent.

The light blocking layer 500 may be disposed on the substrate 100. In detail, the light blocking layer 500 may be disposed on the second resin layer 420. For example, the light blocking layer 500 may be disposed on the upper surface of the second resin layer 420 and may be spaced apart from the substrate 100. The light blocking layer 500 may include a plurality of light blocking pattern regions R2 including an optical film 510 and a plurality of unit light blocking patterns 530. The optical film 510 may include a transparent material. The optical film 510 is spaced apart from the substrate 100 and may transmit light emitted upward from the upper surface of the second resin layer 420. The optical film 510 may include a material having a light transmittance of about 80% or more. In detail, the optical film 510 may include a material having a light transmittance of about 85% or more. The optical film 510 may include at least one of PET (Polyethylene terephthalate), PS (Polystyrene), PI (Polyimide), PEN (Polyethylene naphthalate), PC (Poly carbonate).

The light blocking pattern region R2 may have a set shape. For example, when each of the plurality of light blocking pattern regions R2 is viewed from the top, the light blocking pattern region R2 may have a circular or elliptical polygonal shape, or may have a shape close to the above-mentioned shape. Here, the light blocking pattern region R2 may refer to a region in which the plurality of unit light blocking patterns 530 are formed, and may refer to a region in which outer edges of the plurality of unit light blocking patterns 530 disposed on the outermost side of the region R2 are connected in a straight line or a curve.

The plurality of light blocking pattern regions R2 may be disposed in regions corresponding to the plurality of light emitting devices 200. In detail, the light blocking pattern region R2 may be disposed in a region overlapping the light emitting device 200 in the vertical direction (third direction). In addition, a portion of the light blocking pattern region R2 may be disposed in a region overlapping the reflective pattern region R1 in the vertical direction. The plurality of light blocking pattern regions R2 may be provided in numbers corresponding to the plurality of light emitting devices 200. That is, one light blocking pattern region R2 may be matched with one light emitting device 200 one-to-one. An area of the light blocking pattern region R2 may be greater than an area of the lower surface of the light emitting device 200. For example, the area of the light blocking pattern region R2 may be about 5 times to about 20 times the area of the lower surface of the light emitting device 200. In detail, the area of the light blocking pattern region R2 may be about 8 to about 15 times the area of the lower surface of the light emitting device 200.

The area of the light blocking pattern region R2 may be smaller than an area of a light transmitting region other than the light blocking pattern region R2 in the light blocking layer 500. That is, the total area of the light blocking pattern region R2 may be located between the plurality of light blocking pattern regions R2, and may be smaller than the light transmitting region of the light blocking layer 500 in which the unit light blocking pattern 530 is not disposed. The light blocking pattern region R2 may be disposed in a region vertically overlapping the first pattern region P1 of the electrode layers 110 and 120. In this case, the area of the light blocking pattern region R2 may be greater than that of the first pattern region P1. In detail, the area of the light blocking pattern region R2 may be provided as large as about 1.4 times or less than the area of the first pattern region P1. More specifically, the area of the light blocking pattern region R2 may be provided as large within a range of about 1.25 times or less of the area of the first pattern region P1. That is, as the light blocking pattern region R2 is provided to have an area greater than the first pattern region P1, a part of the light blocking pattern region R2 may be disposed in a region overlapping the second pattern region P2 of the electrode layers 110 and 120 in a vertical direction (z-axis direction).

The plurality of unit light blocking patterns 530 may be disposed on the optical film 510. The unit light blocking pattern 530 may be disposed on at least one of a lower surface of the optical film 510 facing the second resin layer 420 and an upper surface opposite to the lower surface. For example, the unit light blocking pattern 530 may be disposed on the lower surface of the optical film 510 and face the upper surface of the second resin layer 420 as shown in FIG. 5.

The plurality of unit light blocking patterns 530 may include ink. The unit light blocking pattern 530 may be white with excellent reflective properties. For example, the unit light blocking pattern 530 may be printed with a material including any one of $TiO_2$, $CaCO_3$, $BaSO_4$, $Al_2O_3$, Silicon, and PS. Accordingly, the plurality of unit light blocking patterns 530 may protrude from the lower surface of the optical film 510 toward the second resin layer 420.

The plurality of unit light blocking patterns 530 may be spaced apart from each other and disposed on the optical film 510. As shown in FIG. 6, the plurality of unit light blocking patterns 530 may be spaced apart from each other in the first and second directions. For example, the unit light blocking pattern 530 disposed adjacent to the first direction may be spaced apart from each other by a first distance d1, and the unit light blocking pattern 530 disposed adjacent to the second direction may be spaced apart by a second distance d2. In this case, the first distance d1 and the second distance d2 may be the same. For example, the first distance d1 and the second distance d2 may be about 300 μm or less. That is, the plurality of unit light blocking patterns 530 are arranged in row a×column b (a and b are natural numbers greater than or equal to 2) and may be arranged at equal distances in the first and second directions.

The plurality of unit light blocking patterns 530 may be disposed at set positions. For example, the unit light blocking patterns 530 disposed in each row of the first to a-th rows may be disposed on the same line. In detail, an imaginary line connecting centers of unit light blocking patterns 530 disposed in each row may be parallel to the first direction. In addition, the unit light blocking patterns 530 arranged in each column of the first to b-th columns may be arranged on the same line. In detail, an imaginary line connecting the centers of the unit light blocking patterns 530 disposed in each column may be parallel to the second direction. The plurality of unit light blocking patterns 530 may be disposed symmetrically in a horizontal direction with respect to the center of the light blocking pattern region R2. For example, the plurality of unit light blocking patterns 530 may be arranged in a symmetrical shape based on the imaginary lines extending from the center of the light blocking pattern region R2 in first and second directions. Also, the plurality of unit light blocking patterns 530 may be disposed in a shape symmetrical to the origin with respect to the center of the light blocking pattern region R2. Here, the center of the light blocking pattern region R2 may overlap the light emitting device 200 in a vertical direction.

The plurality of unit light blocking patterns 530 may be arranged in a set number. In detail, the number of unit light blocking patterns 530 disposed in the first row to the a-th row (a is a natural number of 2 or greater) in the row a×column b may be different or partially the same. For example, the number of unit light blocking patterns 530 disposed in each of the first to a-th rows may be the largest in a row overlapping or adjacent the center of the light blocking pattern region R2, and may be the smallest in a row furthest from the center of the light blocking pattern region R2, for example, at the first row (uppermost portion in FIG. 6) and a row (lowest portion in FIG. 6).

The number of units blocking patterns 530 disposed in two adjacent rows in the first row to the a-th row may be the same. For example, when a is 5 or more, the number of unit light blocking patterns 530 overlapped with the center of the light blocking pattern region R2 or placed in a row closest to the center may be the same as the number of unit light blocking patterns 530 placed in a row located just above and/or below the row. In addition, the number of unit light blocking patterns 530 disposed in the first to b columns (where b is a natural number of 2 or greater) in row a×column b may be different or partially the same. For example, the number of unit light blocking patterns 530 disposed in each of the first to b columns may overlap the center of the light blocking pattern region R2 or may be disposed in a column furthest from the center of the light blocking pattern region R2, for example, in the first row (leftmost in FIG. 6) and column b (rightmost in FIG. 6). The number of unit light blocking patterns 530 disposed in two adjacent columns in the first to b-th columns may be the same. For example, when b of column b is 5 or more, the number of unit light blocking patterns 530 placed in a row overlapping or closest to the center of the light blocking pattern region R2 may be the same as the number of unit light blocking patterns 530 placed in a column located just left and/or right of the column. In the row a×column b, the values of a and b may be the same. For example, the plurality of unit light blocking patterns 530 may be provided on the light blocking layer 500 in rows a×columns a. In this case, the number of unit light blocking patterns 530 disposed in each of the first to a-th rows may be the same as the number of unit light blocking patterns 530 disposed in the corresponding first to a-th columns. That is, the number of unit light blocking patterns 530 disposed in n rows and n columns may be the same. For example, when the unit light blocking patterns 530 are arranged in rows 7×columns 7 in the light blocking pattern region R2 as shown in FIG. 6, the number of unit light blocking patterns 530 respectively disposed in the first row and the first column may be the same, and the number of unit light blocking patterns 530 respectively disposed in the third row and the third column may be provided equally.

Densities of the plurality of unit light blocking patterns 530 may vary in the light blocking pattern region R2. For example, the density of the plurality of unit light blocking patterns 530 may decrease as the distance from the region overlapping the optical axis of the light emitting device 200 in the vertical direction increases. The plurality of unit light blocking patterns 530 may have a set size. In detail, each of the unit light blocking patterns 530 arranged in row a×column b may have a set size. For example, the unit light blocking patterns 530 disposed in two adjacent rows among row a may have the same size. In detail, the size of the unit light blocking pattern 530 overlapped with the center of the light blocking pattern region R2 or placed in the row closest to the center in row a may be the same as the size of the unit light blocking pattern 530 placed in the upper and/or lower row. The size of unit blocking patterns 530 disposed in two adjacent columns among column b may be the same. In detail, the size of the unit light blocking pattern 530 in the column b overlapping the center of the light blocking pattern region R2 or closest to the center may be the same as the size of the unit light blocking pattern 530 in the column located on the left and/or right.

For example, the plurality of unit light blocking patterns 530 may include a center pattern 539, a first pattern 531, a second pattern 532, a third pattern 533, and a fourth pattern 534. The center pattern 539 may overlap the center of the light blocking pattern region R2 or may be disposed in a region closest to the center. The first pattern 531 may be disposed on the leftmost side (first row) of the light blocking pattern region R2, and the second pattern 532 may be disposed on the rightmost side (b-th row) of the light blocking pattern region R2. In addition, the third pattern 533 may be disposed on the uppermost side (first row) of the light blocking pattern region R2, and the fourth pattern 534 may be disposed on the lowermost side (a-th row) of the light blocking pattern region R2. Here, the first to fourth patterns 531, 532, 533, and 534 may be unit light blocking patterns 530 located at the furthest distance from the light emitting device 200. In this case, each of the center pattern 539 and the first to fourth patterns 531, 532, 533, and 534 has a first horizontal length C1 and a first vertical length C2 and may have the same size as each other. That is, the plurality of unit light blocking patterns 530 arranged in row a×column b may be provided in the same size (planar area) regardless of the distance from the light emitting device 200. In this case, the first horizontal length C1 and the first vertical length C2 may be about 300 µm or less. In detail, the first horizontal length C1 and first vertical length C2 may be about 250 µm or less. In addition, the first horizontal length C1 and the first vertical length C2 may be equal to each other within the above-described range. When the first horizontal length C1 and the first vertical length C2 exceed about 300 µm, a hot spot in which light emitted from the light emitting device 200 is concentrated may be effectively prevented. However, since an area occupied by the unit light blocking pattern 530 in the light blocking layer 500 increases, overall luminance of the lighting device 1000 may decrease. Therefore, it is preferable that the size of the unit light blocking pattern 530 satisfies the above-mentioned range in order to prevent formation of hot spots and decrease in overall luminance of the device.

The lighting device 1000 may further include a protective layer (not shown). The protective layer may be disposed on the light blocking layer 500. The protective layer is a layer located at the top of the lighting device 1000 and may serve to protect elements disposed thereunder. The protective layer may include a light transmitting material. In detail, the protective layer may include a material through which light passing through the upper and lower surfaces is transmitted. That is, the protective layer may be a light transmitting layer.

For example, the protective layer may include at least one of PET (Polyethylene terephthalate), PS (Polystyrene), PI (Polyimide), PEN (Polyethylene naphthalate), PC (Poly carbonate). The protective layer has a set thickness and may protect elements disposed below. For example, the protective layer may have a thickness of about 500 µm to about 3 mm. In detail, the protective layer may have a thickness of about 800 µm to about 2.5 mm. When the thickness of the protective layer is less than about 500 µm, it may be difficult to effectively protect components disposed below due to the relatively thin thickness. In addition, when the thickness of the protective layer exceeds about 3 mm, the total thickness of the lighting device 1000 may increase, and luminance may decrease. In addition, when the thickness of the protective layer exceeds about 3 mm, the flexibility of the lighting device 1000 may be reduced due to the thickness. In this case, the structure and form to which the lighting device 1000 may be applied may be limited. Therefore, the thickness of the protective layer preferably satisfies the above-mentioned range.

The lighting device 1000 according to the embodiment may include a light blocking layer 500 including a light blocking pattern region R2, and the light blocking pattern region R2 may include a plurality of unit light blocking patterns 530. In this case, the plurality of unit light blocking patterns 530 may have the same shape and size and may be disposed at equal distances, and the light blocking pattern region R2 may have a set area in a region corresponding to the light emitting device 200. Accordingly, the lighting device 1000 can effectively prevent the concentration of light emitted from the light emitting device 200 to provide uniform luminance light, and can effectively prevent the total luminance of light emitted by the light blocking pattern region R2 from decreasing. Accordingly, the lighting device 1000 according to the embodiment may provide a uniform line light source or a surface light surface.

Figure 7:
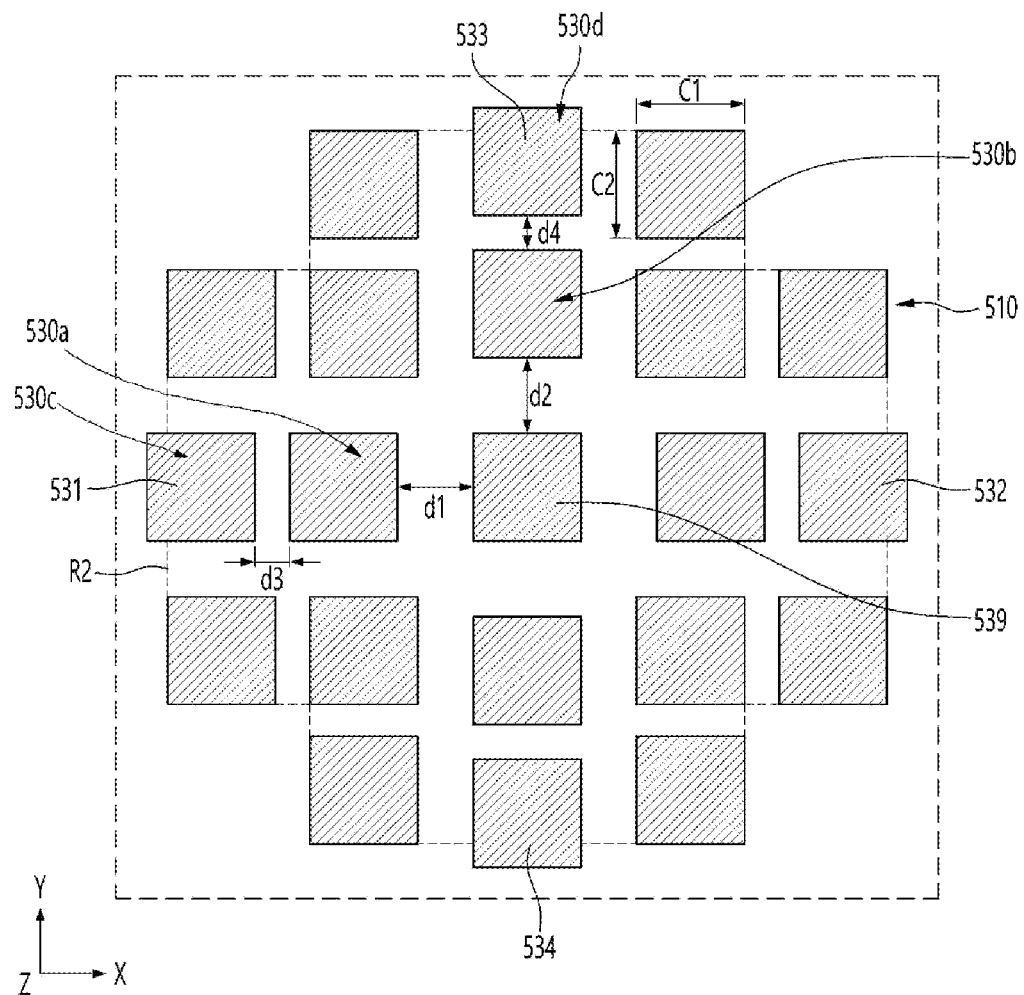
FIGS. 7 and 8 are other plan views of light blocking layers according to the embodiment.

FIG. 7 is another plan view of a light blocking layer according to the embodiment. In the description using FIG. 7, the same reference numerals are assigned to the same and similar components, while the same and similar configurations as those of the lighting device described above are omitted.

Referring to FIG. 7, the light blocking layer 500 may include a plurality of light blocking pattern regions R2 including an optical film 510 and a plurality of unit light blocking patterns 530. The plurality of unit light blocking patterns 530 may be disposed on the optical film 510. The unit light blocking pattern 530 may be disposed on at least one of lower and upper surfaces of the optical film 510.

The plurality of unit light blocking patterns 530 may be spaced apart from each other and disposed on the optical film 510. As shown in FIG. 7, the plurality of unit light blocking patterns 530 may be spaced apart from each other in the first and second directions. In this case, the distance between the unit light blocking patterns 530 may be changed. In detail, the distance between the unit light blocking patterns 530 may decrease as the distance from the center of the light blocking pattern region R2 increases. For example, the distance between the center pattern 539 overlapped with the center of the light blocking pattern R2 or adjacent to the center and the first unit light blocking pattern 530a spaced apart in the first direction may be a first distance d1, and the distance between the center pattern 539 and the second unit light blocking pattern 530b may be a second distance d2. In addition, a distance between the first unit light blocking pattern 530a and the third unit light blocking pattern 530c spaced apart in the first direction may be a third distance d3, and a distance between the second unit light blocking pattern 530b and the fourth unit light blocking pattern 530d spaced apart in the second direction may be a fourth distance d4. In this case, the first distance d1 and the second distance d2 may be about 300 µm or less, and the third distance d3 and the fourth distance d4 may be smaller than the first distance d1 and the second distance d2. In addition, at the same time as satisfying the above-described conditions, the first distance d1 and the second distance d2 may have the same interval, and the third distance d3 and the fourth distance d4 may have the same interval.

The plurality of unit light blocking patterns 530 are arranged in row a×column b (a and b are natural numbers of 2 or more) and may be disposed at a set position. In detail, the unit light blocking pattern 530 disposed in some of the first to a-th rows may be disposed on the same line, and the unit light blocking pattern 530 disposed in the other row may not be disposed on the same line. Also, the unit blocking patterns 530 disposed in some of the first to b-th columns may be disposed on the same line, and the unit blocking patterns 530 disposed in the other columns may not be disposed on the same line. For example, among the 'a' number of rows, the unit blocking patterns 530 overlapping with or closest to the center of the blocking pattern region R2 may be arranged on the same line. That is, an imaginary line connecting the center of the unit light blocking pattern 530 in the row (the row overlapping or closest to the center) may be parallel to the first direction. However, the unit light blocking pattern 530 arranged in a row other than the above row (the row overlapping the center or the row closest to the center) may not be arranged on the same line. In detail, among the unit light blocking patterns 530 disposed in each of the rows, the unit light blocking pattern 530 disposed in the center region of the row may be located above or below the remaining unit light blocking patterns 530 disposed in the same row. For this reason, an imaginary line connecting the centers of the unit light blocking patterns 530 in the row may not be parallel to the first direction.

Among the b columns of the unit blocking pattern 530, the unit blocking pattern 530 disposed in a column overlapping with or closest to the center of the blocking pattern region R2 may be disposed on the same line. That is, an imaginary line connecting the center of the unit light blocking pattern 530 in the column (column overlapping or closest to the center) may be parallel to the second direction. However, the unit light blocking pattern 530 disposed in the b columns other than the above columns (columns not overlapped with the center or closest to the center) may not be disposed on the same line. In detail, among the unit blocking patterns 530 disposed in each of the columns, the unit blocking pattern 530 disposed in the central region of the column may be located on the left or right side of the remaining unit blocking patterns 530 disposed in the same column. For this reason, an imaginary line connecting the centers of the unit light blocking patterns 530 in the column may not be parallel to the second direction.

For example, referring to FIG. 7, in an uppermost first row, the unit blocking pattern 530 disposed at the center of the first row may be disposed above the remaining unit blocking patterns 530. Also, in the leftmost first column, the unit light blocking pattern 530 disposed at the center of the first column may be disposed to the left of the remaining unit light blocking patterns 530. That is, some unit light blocking patterns 530 arranged in the same row and/or in the same column may not be aligned with the other unit light blocking patterns 530 because the distance between the unit light blocking pattern 530 decreases as it moves away from the light emitting device 200.

The plurality of unit light blocking patterns 530 may have a set size. In detail, each of the unit light blocking patterns 530 arranged in row a×column b may have a set size. For example, the unit light blocking patterns 530 arranged in row a×column b may have the same size as each other. That is, the center pattern 539, the first pattern 531, the second pattern 532, the third pattern 533, and the fourth pattern 534 disposed at different positions in the light blocking pattern region R2 may have the same horizontal lengths C1 and C2. The plurality of unit light blocking patterns 530 arranged in row a×column b may have the same size regardless of a distance from the light emitting device 200.

The lighting device 1000 according to the embodiment may include a light blocking layer 500 including a light blocking pattern region R2, and the light blocking pattern region R2 may include a plurality of unit light blocking patterns 530. In this case, the plurality of unit light blocking patterns 530 may have the same shape and size, and the distance between adjacent unit light blocking patterns 530 may decrease as the distance from the light emitting device 200 increases. Accordingly, the lighting device 1000 may prevent the concentration of light emitted from the light emitting device 200 to provide uniform brightness and prevent the total brightness of light emitted by the light blocking pattern region R2 from deteriorating. Accordingly, the lighting device 1000 according to the embodiment may provide a uniform line light source or a surface light surface.

Figure 8:
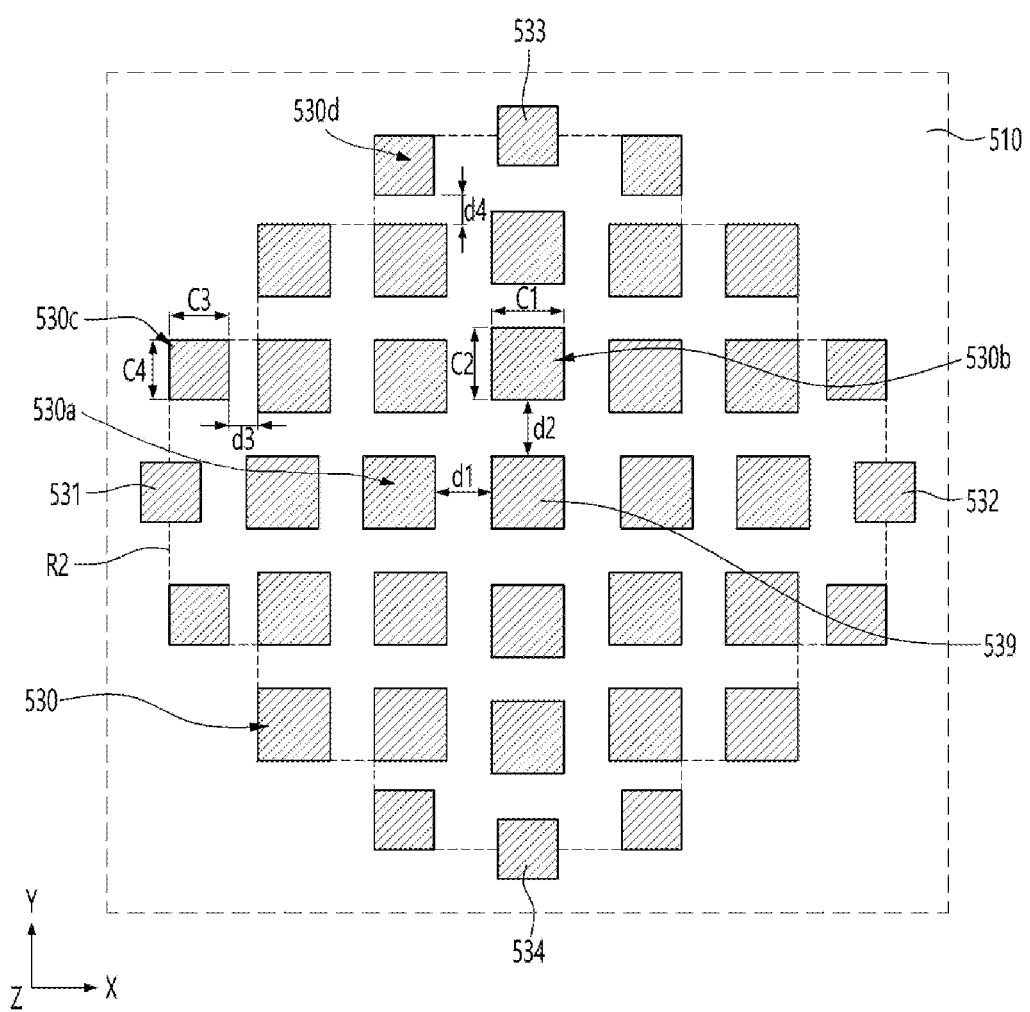

FIG. 8 is another plan view of a light blocking layer according to the embodiment. In the description using FIG. 8, the same reference numerals are assigned to the same and similar components, while the same and similar configurations as those of the lighting device described above are omitted.

Referring to FIG. 8, the light blocking layer 500 may include a plurality of light blocking pattern regions R2 including an optical film 510 and a plurality of unit light blocking patterns 530. The plurality of unit light blocking patterns 530 may be disposed on the optical film 510. The unit light blocking pattern 530 may be disposed on at least one of lower and upper surfaces of the optical film 510.

The plurality of unit light blocking patterns 530 may be spaced apart from each other and disposed on the optical film 510. As shown in FIG. 8, the plurality of unit light blocking patterns 530 may be spaced apart from each other in the first and second directions. In this case, the distance between the unit light blocking patterns 530 may be changed. In detail, the distance between the unit light blocking patterns 530 may decrease as the distance from the center of the light blocking pattern region R2 increases. For example, a distance between the center pattern 539 overlapped with the center of the light blocking pattern R2 or adjacent to the center and the first unit light blocking pattern 530a spaced apart in the first direction may be a first distance d1, and a distance between the center pattern 539 and the second unit light blocking pattern 530b may be a second distance d2. In addition, a distance in the first direction between the third unit light blocking pattern 530c disposed in the edge region of the light blocking pattern region R2 and the unit light blocking pattern 530 adjacent to the first direction may be a third distance d3, and a distance in the second direction between the fourth unit light blocking pattern 530d disposed in the edge region and the unit light blocking pattern 530 adjacent to the second direction may be a fourth distance d4. In this case, the first distance d1 and the second distance d2 may be about 300 µm or less, and may be equal to each other within the above range. Also, the third distance d3 and the fourth distance d4 may be smaller than the first distance d1 and the second distance d2 and may be equal to each other.

The plurality of unit light blocking patterns 530 are arranged in row a×column b (a and b are natural numbers of 2 or more) and may be disposed at a set position. In detail, the unit light blocking pattern 530 disposed in some of the first to a-th rows may be disposed on the same line, and the unit light blocking pattern 530 disposed in the other row may not be disposed on the same line. Also, the unit blocking patterns 530 disposed in some of the first to b-th columns may be disposed on the same line, and the unit blocking patterns 530 disposed in the other columns may not be disposed on the same line. For example, the unit light blocking patterns 530 disposed in rows and columns overlapping with or closest to the center of the light blocking pattern region R2 may be arranged on the same line. In detail, the centers of the unit light blocking patterns 530 respectively disposed in the rows and columns may be disposed on the same line in the first and second directions, respectively. However, unit light blocking patterns 530 disposed in rows and columns other than the above rows and columns (rows and columns not overlapping with the center or disposed closest to the center) may not be disposed on the same line. In detail, some of the plurality of unit light blocking patterns 530 respectively disposed in the row and column may be positioned above, below, left, or right of the remaining unit light blocking patterns 530 disposed in the same row and column. For this reason, an imaginary line connecting the centers of the unit light blocking patterns 530 in the rows and columns may not be parallel to the first or second direction.

The plurality of unit light blocking patterns 530 may have a set size. In detail, each of the unit light blocking patterns 530 arranged in row a×column b may have a set size. For example, the size of the unit light blocking pattern 530 may decrease as the distance from the region overlapping the optical axis of the light emitting device 200 increases. That is, in the light blocking pattern region R2, the center pattern 539 may have a first horizontal length C1 and a first vertical length C2, and may be greater than the sizes of the first pattern 531, the second pattern 532, the third pattern 533, and the fourth pattern 534. In addition, the first pattern 531, the second pattern 532, the third pattern 533, and the fourth pattern 534 disposed at the edge of the light blocking pattern R2 have a second horizontal length C3, and a second vertical length C4, and may have the smallest size (planar surface) of the plurality of unit light blocking patterns 530.

The lighting device 1000 according to the embodiment may include a light blocking layer 500 including a light blocking pattern region R2, and the light blocking pattern region R2 may include a plurality of unit light blocking patterns 530. In this case, the horizontal and vertical lengths of the plurality of unit light blocking patterns 530 may decrease as the distance from the light emitting device 200 increases, and the distance from the light emitting device 200 may decrease an interval between adjacent unit light blocking patterns 530. Accordingly, the lighting device 1000 may prevent the concentration of light emitted from the light emitting device 200 to provide uniform brightness and prevent the total brightness of light emitted by the light blocking pattern region R2 from deteriorating. Accordingly, the lighting device 1000 according to the embodiment may provide a uniform line light source or a surface light surface.

Figure 9:
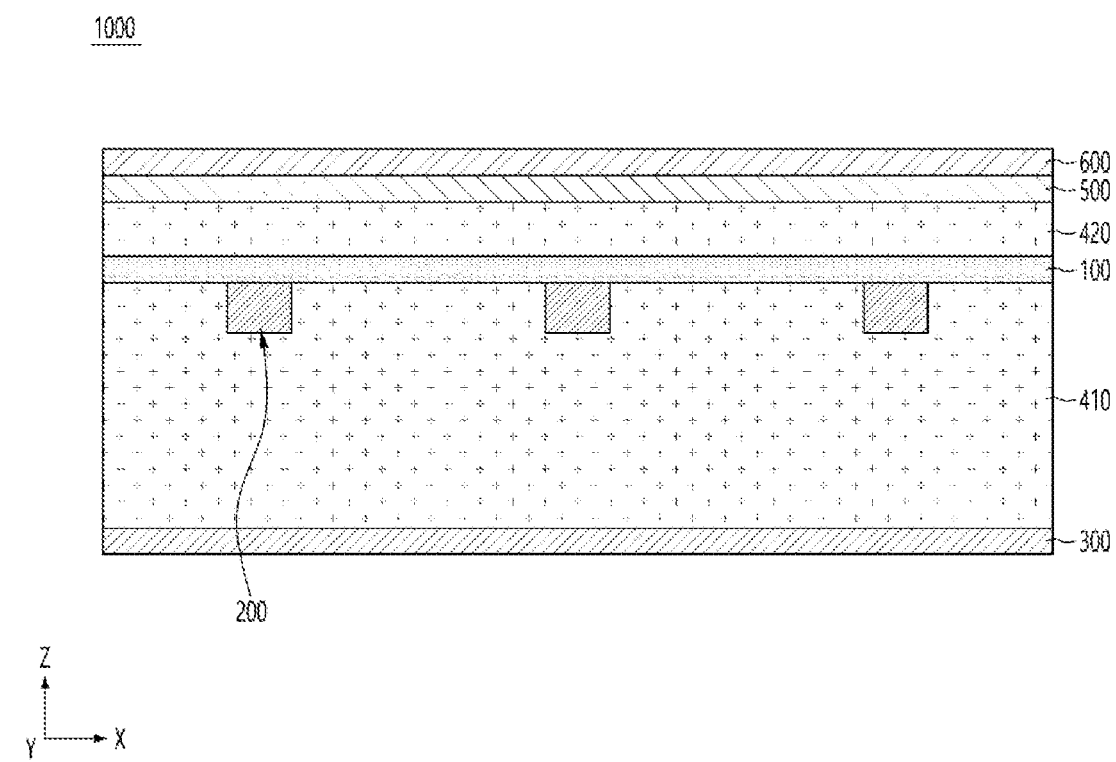
FIG. 9 is a cross-sectional view of a lighting device according to the embodiment including a half mirror layer.
Figure 10:
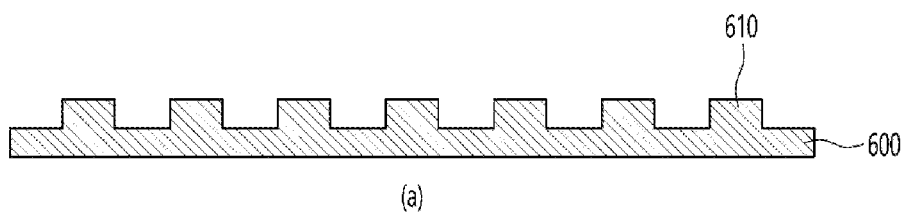
FIG. 10 is another cross-sectional view of a half mirror layer according to the embodiment.
Figure 10:
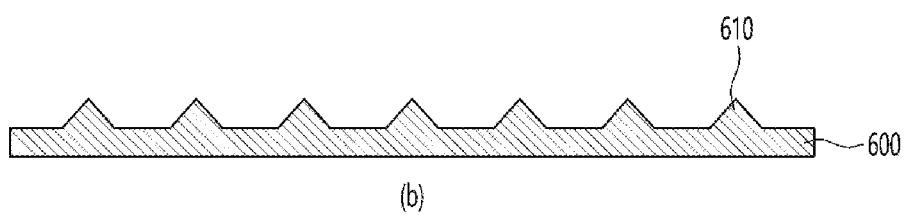
Figure 10:
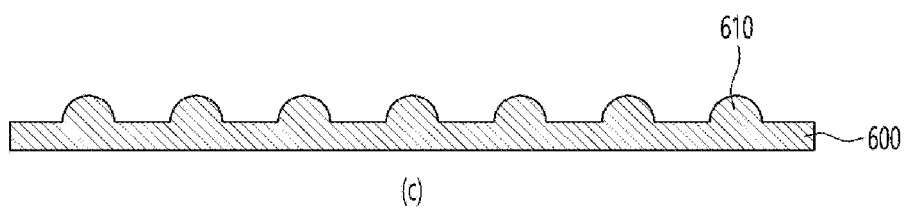

FIG. 9 is a cross-sectional view of a lighting device according to the embodiment including a half mirror layer, and FIG. 10 is another cross-sectional view of the half mirror layer according to the embodiment. In the description using FIGS. 9 and 10, the same reference numerals are given to the same and similar components as the above-described lighting apparatus and the same and similar configurations are omitted.

Referring to FIGS. 9 and 10, the lighting device 1000 according to the embodiment may further include a half mirror layer 600. The half mirror layer 600 may be disposed on the light blocking layer 500. When the lighting device 1000 includes the protective layer, the half mirror layer 600 may be disposed between the light blocking layer 500 and the protective layer. The half mirror layer 600 is provided on a plane corresponding to the light blocking layer 500 and may be provided as a translucent mirror. For example, the half mirror layer 600 may be formed by coating and depositing a metal such as aluminum (Al), nickel (Ni), titanium (Ti), or copper (Cu) as a thin film on a transparent substrate.

The half mirror layer 600 may have a set thickness. For example, the thickness of the half mirror layer 600 may be uniformly provided throughout. Alternatively, the thickness of the half mirror layer 600 may be thicker in a region overlapping the light emitting device 200 in a vertical direction than in a non-overlapping region. In detail, the thickness of a region where a hot spot is formed in the half mirror layer 600 may be thicker than that of a region where no hot spot is formed. For example, referring to FIG. 10, the half mirror layer 600 may include a protruding pattern 610 disposed in a region overlapping the light emitting device 200 in a vertical direction. The protruding pattern 610 may be formed by coating and depositing the metal relatively thickly, and may be provided with a width greater than that of the light emitting device 200 in a horizontal direction. In addition, the protruding pattern 610 may have various cross-sectional shapes. For example, the cross-sectional shape of the protruding pattern 610 may have various shapes such as a polygon such as a square (see FIG. 10(a)), a triangle (see FIG. 10(b)), and a hemispherical shape (see FIG. 10(c)).

The lighting device 1000 according to the embodiment may have improved aesthetics due to the half mirror layer 600 having set transmittance and reflectance. In detail, when the lighting device 1000 emits light, light emitted from the light emitting device 200 may pass through the half mirror layer 600 and be provided to the outside. When the lighting device 1000 does not emit light, the color of the half mirror layer 600 is visually recognized from the outside, so that improved aesthetics may be obtained. For example, when the lighting device 1000 does not emit light, the half mirror layer 600 may be provided with the same color as the periphery region of the lighting device 1000. In this case, the lighting device 1000 may have a hidden effect capable of minimizing external visibility by the half mirror layer 600.

The half mirror layer 600 may more effectively prevent light emitted from the light emitting device 200 from being concentrated by including the protruding pattern 610. Accordingly, light emitted through the half mirror layer 600 may have uniform luminance, and the lighting device 1000 may provide a line light source or a surface light source having improved light characteristics.

Figure 11:
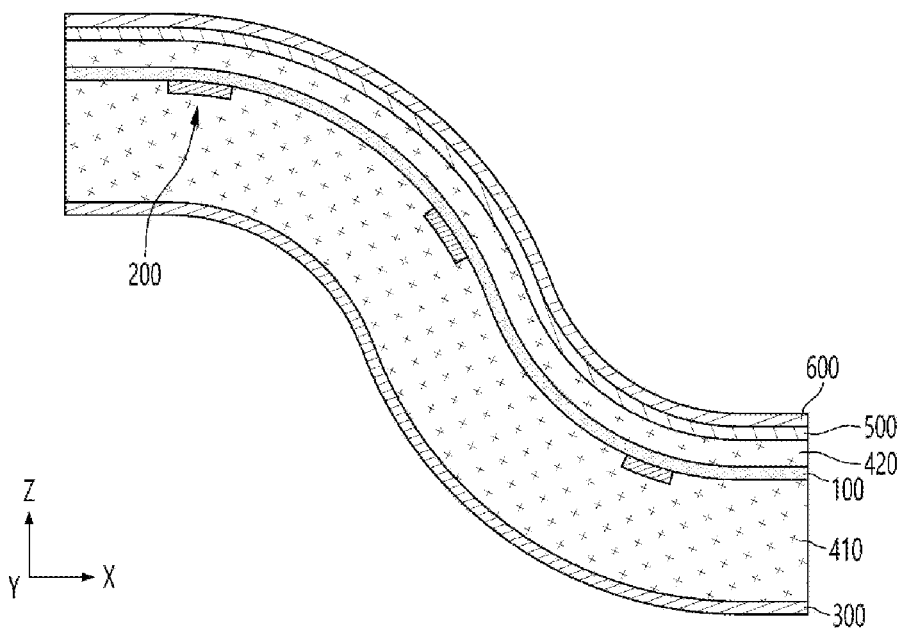
FIGS. 11 and 12 are views showing that the lighting device according to the embodiment has a shape bent in various directions.
Figure 12:
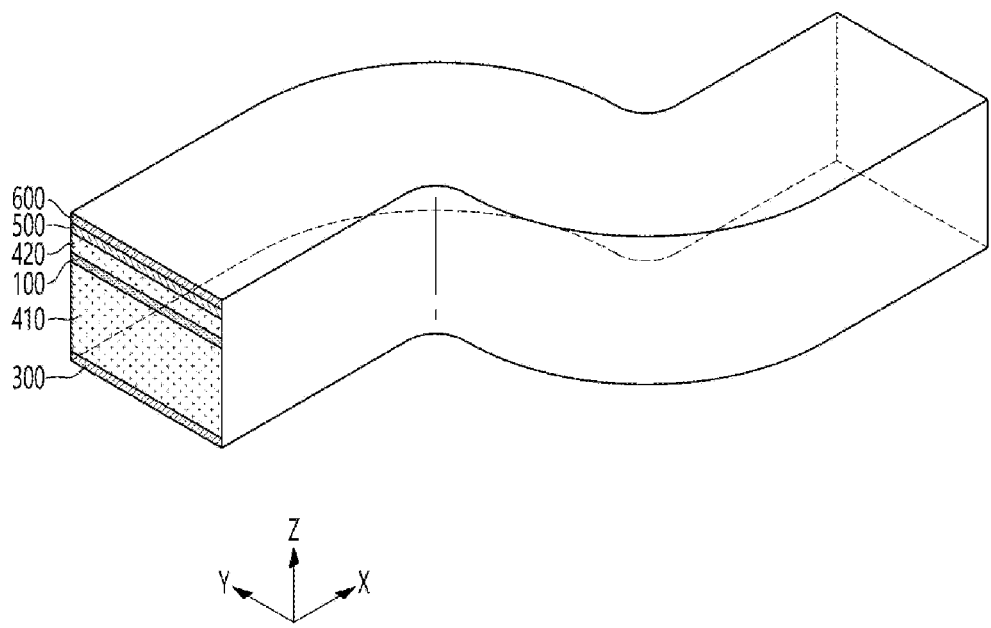

FIGS. 11 and 12 are views showing that the lighting device according to the embodiment has a shape bent in various directions. In the description using FIGS. 11 and 12, the same reference numerals are assigned to the same and similar components, while the same and similar configurations as those of the lighting device described above are omitted.

Referring to FIGS. 11 and 12, the plurality of light emitting devices 200 may be spaced apart from each other and arranged in row c×column d (c and d are different natural numbers). In this case, the first resin layer 410 covering the plurality of light emitting devices 200 may have a long axis and a short axis corresponding to the row c and column d, and the lighting device 1000 may have a long axis and a short axis corresponding to the first resin layer 410. The lighting device 1000 may be provided in a linear shape extending in one direction. For example, the long and short axes of the first resin layer 410 may have a straight line extending in the first direction (x-axis direction) without a separate curvature. As shown in FIGS. 11 and 12, the lighting device 1000 according to the embodiment may be provided in a form bent in at least one direction among first to third directions (x, y, and z-axis directions). For example, at least one of the long and short axes of the first resin layer 410 may include a curvature.

Referring to FIG. 11, the long axis of the first resin layer 410 may include a curvature. In detail, the upper and lower surfaces of the first resin layer 410 may include curved surfaces having a predetermined curvature. Accordingly, the lighting device 1000 may be provided in a meandering shape in a vertical direction (z-axis direction; third direction).

Also, referring to FIG. 12, the long axis of the second resin layer 420 may include a curvature. In detail, both side surfaces of the first resin layer 410 may include curved surfaces having a predetermined curvature. Accordingly, the lighting device 1000 may be provided in a horizontally curved shape. The lighting device 1000 according to the embodiment may be provided in various shapes including a long axis and a short axis, and the long axis and the short axis may be provided in a shape including a linear or a curved line. Accordingly, the lighting device 1000 may be provided in a straight line or a curved shape to substrates having various shapes to provide a linear light source or a surface light source with uniform brightness.

Figure 13:
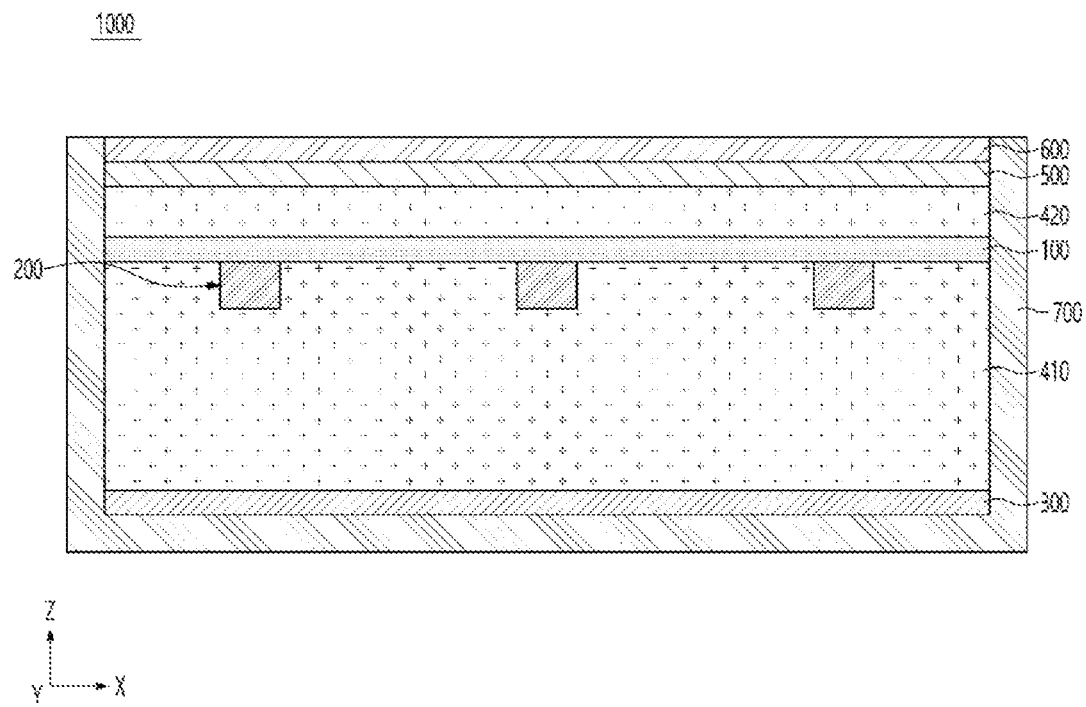
FIGS. 13 and 14 are cross-sectional views of a lighting device according to the embodiment including a housing.
Figure 14:
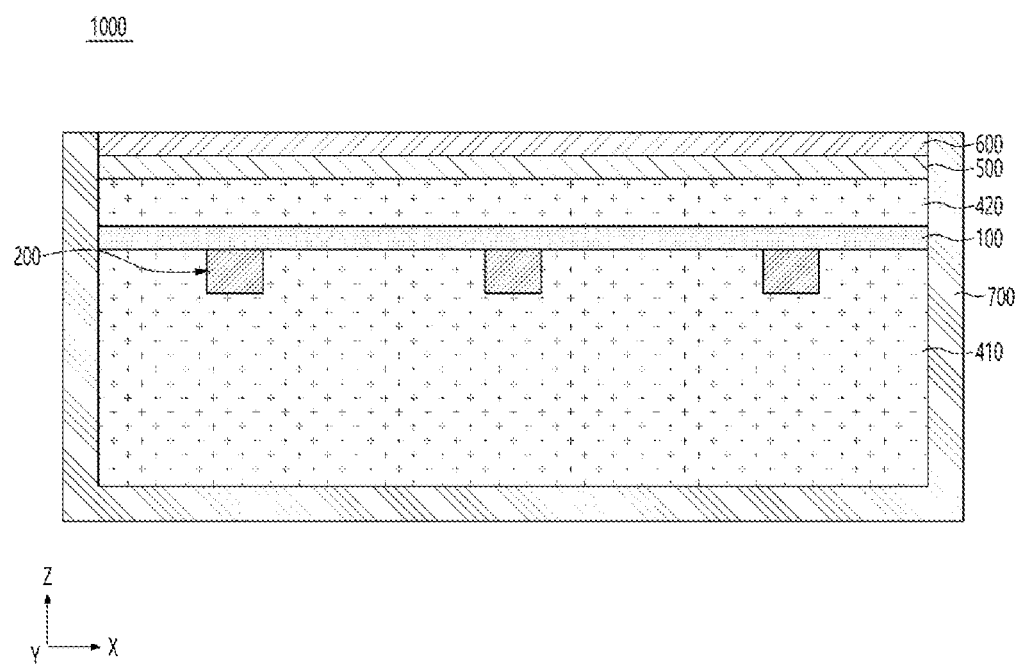

FIGS. 13 and 14 are cross-sectional views of a lighting device according to an embodiment further including a housing. In the description using FIGS. 13 and 14, the same reference numerals are assigned to the same and similar components, while the same and similar configurations as those of the lighting device described above are omitted.

Referring to FIGS. 13 and 14, the lighting device 1000 according to the embodiment may further include a housing 700. The housing 700 may include a material having predetermined reliability. For example, the housing 700 may include a non-metal material such as a metal material, resin, or ceramic. The housing 700 has an open upper region and may include a receiving space therein. Some components of the lighting device 1000 may be disposed in the receiving space of the housing 700. For example, the reflective layer 300, the first resin layer 410, the light emitting device 200, the transparent substrate 100, the second resin layer 420, and the light blocking layer 500 may be disposed in the receiving space. In addition, when the lighting device 1000 further includes the half mirror layer 600 as shown in FIG. 9, the half mirror layer 600 may be further disposed in the receiving space.

The housing 700 may be disposed while enclosing components disposed in the receiving space. Specifically, the housing 700 may be disposed to surround side surfaces of the reflective layer 300, the first resin layer 410, the transparent substrate 100, the second resin layer 420, the light blocking layer 500, and the half mirror layer 600. For example, the housing 700 may be disposed on each of the lower surface of the reflective layer 300, the first resin layer 410, the transparent substrate 100, the second resin layer 420, the light blocking layer 500, and the half mirror layer 600 in direct contact. Accordingly, the lighting device 1000 may provide a uniform line light source or a surface light surface to the open upper region of the housing 700. In addition, as the housing 700 is arranged to surround the above-described components, the lighting device 1000 may have improved reliability.

The housing 700 may include a material having excellent reflection characteristics or may be provided in a color having excellent light reflection characteristics. Accordingly, the housing 700 may prevent light loss by reflecting the light emitted through the side surface of the first resin layer 410. In addition, the housing 700 may maximize the amount of light emitted in the open upper direction of the housing 700 by reflecting light emitted through the side surface of the substrate 100, the side surface of the second resin layer 420, the side surface of the light blocking layer 500 and the side surface of the half mirror layer 600.

When the housing 700 has a light reflectance greater than or equal to a set value, the reflective layer 300 may be omitted as shown in FIG. 14. That is, the light emitting surface of the light emitting device 200 may be disposed facing the bottom surface of the receiving space, and the light emitted from the light emitting device 200 may be reflected on the bottom surface and provided in the upper direction of the first resin layer 410. In this case, the lighting device 1000 may be provided slimmer.

Figure 15:
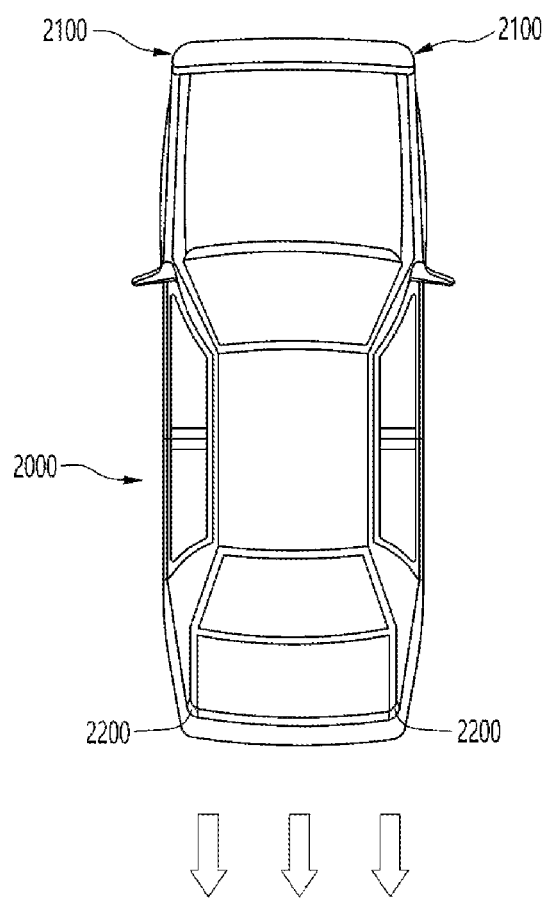
FIGS. 15 to 19 are diagrams illustrating examples in which a lamp including a lighting device according to the embodiment is applied to a vehicle.
Figure 16:
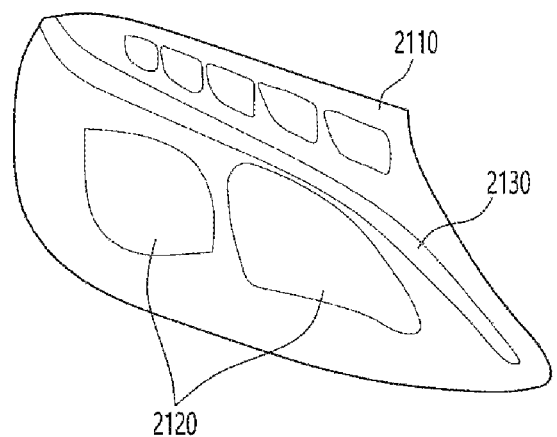
Figure 17:
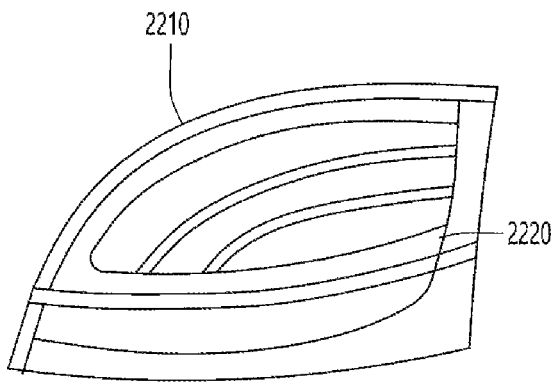
Figure 18:
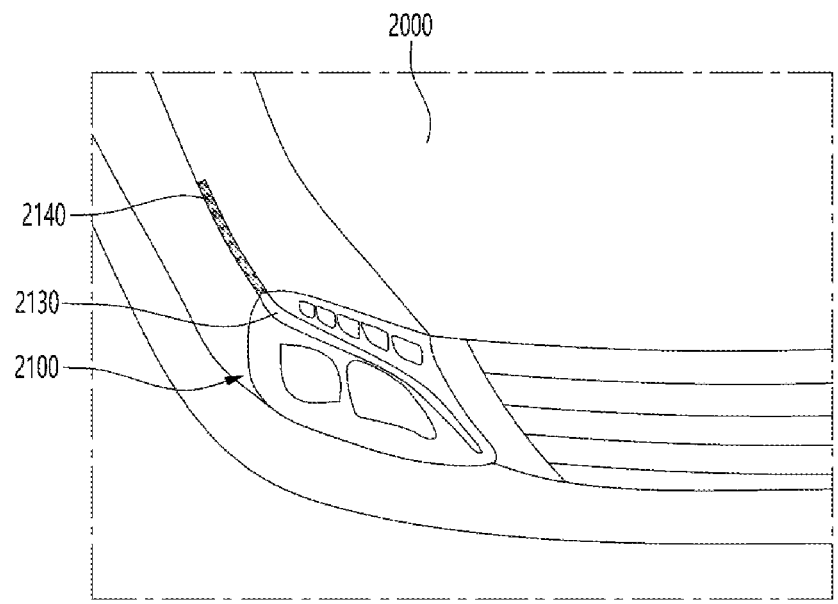
Figure 19:
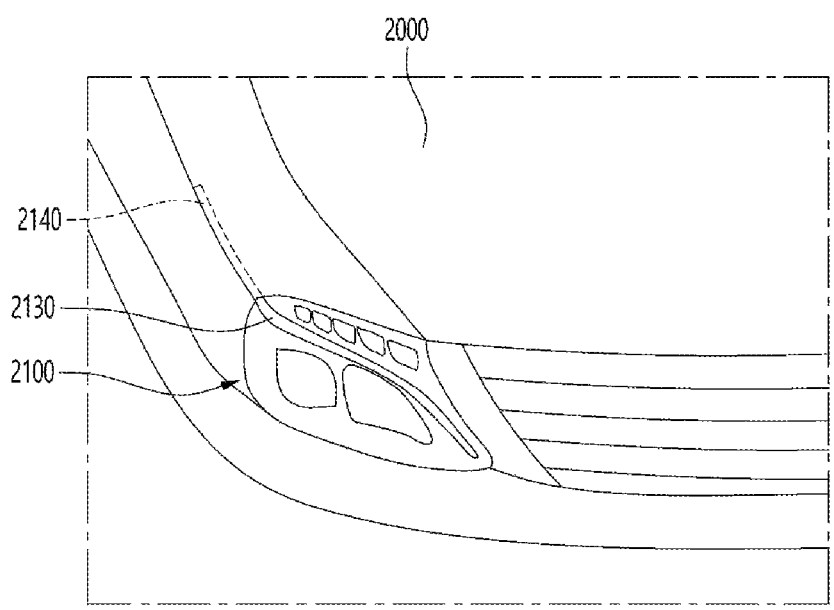

FIGS. 15 to 19 are diagrams illustrating examples in which a lamp including a lighting device according to an embodiment is applied to a mobile device, for example, a vehicle. In detail, FIG. 15 is a top view of a vehicle to which a lamp having the lighting device is applied. FIG. 16 is an example in which a lighting device according to an embodiment is disposed in front of a vehicle, and FIG. 17 is an example in which a lighting device according to an embodiment is disposed in the rear of a vehicle. FIGS. 18 and 19 are examples for explaining that the lighting device according to the embodiment operates as a hidden lamp in front of the vehicle.

Referring to FIGS. 15 to 19, the lighting device 1000 according to the embodiment may be applied to a lamp of a vehicle 2000. One or more lamps may be disposed at least one of the front, rear, and side surfaces of the vehicle 2000. The lighting device 1000 is provided in various shapes such as curves and straight lines, and may be applied to lamps disposed in various areas of the vehicle 2000. For example, referring to FIG. 16, the lamp may be applied to a front lamp 2100 of a vehicle 2000. The front lamp 2100 may include at least one lamp module including the first cover member 2110 and the lighting device 1000. The first cover member 2110 may accommodate the lighting device 1000. The front lamp 2100 may provide a plurality of functions by controlling the driving timing of the lighting device 1000 included in at least one lamp module. For example, the front lamp 2100 may include a first lamp module 2120 and a third lamp module 2130 that provide at least one of a headlight, a turn signal, a daytime running light, a high beam, a low beam, and a fog light by the light emission of the lighting device 1000. In addition, the front lamp 2100 may provide additional functions such as a welcome light or a celebration effect when the driver opens the vehicle door.

Referring to FIG. 17, the lamp may be applied to a rear lamp 2200 of a vehicle. The rear lamp 2200 may include at least one lamp module including the second cover member 2210 and the lighting device 1000. The second cover member 2210 may accommodate the lighting device 1000. The rear lamp 2200 may provide a plurality of functions by controlling the driving timing of the lighting device 1000 included in at least one lamp module. For example, the rear lamp 2200 may include a second lamp module 2220 that provides at least one function of a sidelight, a brake light, and a direction indicator light by light emitted from the lighting device 1000. At this time, the lamp module included in at least one of the front lamps 2100 and the rear lamp 2200 may be provided in a color set according to on or off.

For example, referring to FIGS. 18 and 19, the front lamp 2100 may further include a fourth lamp module 2140. The lighting device 1000 included in the fourth lamp module 2140 may include the half mirror layer 600 described above, and the half mirror layer 600 may have a color corresponding to the color of the vehicle 2000. The fourth lamp module 2140 may emit light or not emit light according to applied power. For example, as shown in FIG. 18, the fourth lamp module 2140 may operate in an on state of emitting light of the light emitting device 200. In this case, light emitted from the light emitting device 200 may pass through the half mirror layer 600 and be viewed from the outside of the fourth lamp module 2140. For example, the fourth lamp module 2140 may provide a function of a direction indicator lamp by emitting light of an amber color.

As shown in FIG. 19, the fourth lamp module 2140 may be in an off state in which the light emitting device 200 does not emit light. In this case, light may not be emitted from the light emitting device 200, and the half mirror layer 600 may reflect light of a color identical to or corresponding to that of the vehicle 2000. Accordingly, the same or similar color as that of the vehicle 2000 may be viewed from the outside of the fourth lamp module 2140.

In the embodiment, when the fourth lamp module 2140 is turned on, a uniform line light source or a surface light surface with little luminance variation may be provided. In addition, when the fourth lamp module 2140 is turned off, the fourth lamp module 2140 may have a hidden effect capable of minimizing or not being recognized from the outside. In addition, the lighting device 1000 may be provided in various shapes such as a straight line or a curve, so it may be applied to various curved regions of the vehicle 2000.

Features, structures, effects, etc. described in the embodiments above are included in at least one embodiment of the invention, and are not necessarily limited to only one embodiment. Furthermore, the features, structures, effects, etc. illustrated in each embodiment can be combined or modified with respect to other embodiments by those skilled in the art in the field to which the embodiments belong. Therefore, contents related to these combinations and variations should be construed as being included in the scope of the invention. In addition, although described based on the embodiments above, this is only an example, not limiting this invention, it will be apparent to those skilled in the art that various modifications and applications not illustrated above can be made without departing from the essential characteristics of this embodiment. For example, each component specifically shown in the embodiment can be modified and implemented. And the differences related to these modifications and applications should be construed as being included in the scope of the invention as defined in the appended claims.

The invention claimed is:

1. A lighting device comprising:
a reflective layer;
a resin layer disposed on the reflective layer;
a transparent substrate disposed on the resin layer;
an electrode layer provided on a lower surface of the substrate;
a plurality of light emitting devices disposed on a lower surface of the electrode layer; and
a light blocking layer disposed above the transparent substrate,
wherein the electrode layer comprises a first electrode and a second electrode,
wherein the first electrode includes:
a first pad disposed in a region corresponding to a first bonding portion of the light emitting device; and
a first electrode pattern disposed around the first pad,
wherein the second electrode includes:
a second pad disposed in a region corresponding to a second bonding portion of the light emitting device; and
a second electrode pattern disposed around the second pad,
wherein each of the first electrode pattern and the second electrode pattern comprises:
a first pattern region disposed adjacent to each of the light emitting devices; and
a second pattern region disposed outside the first pattern region, and
wherein each of the first electrode pattern and the second electrode pattern has a mesh shape defining a plurality of closed openings.

2. The lighting device according to claim 1, wherein each of the first pattern regions of the first and second electrode patterns includes:
a plurality of first sub-wires extending in a first direction; and
a plurality of second sub-wires extending in a second direction which is different from the first direction, and
wherein each of the second pattern regions of the first and second electrode pattern regions includes:
a plurality of third sub-wires extending in the first direction; and
a plurality of fourth sub-wires extending in the second direction.

3. The lighting device according to claim 2, wherein line widths of the first to fourth sub-wires are equal to each other.

4. The lighting device according to claim 3, wherein a first width of adjacent first sub-wires of the first pattern region and a second width of adjacent second sub-wires of the first pattern region are the same as each other, and/or
wherein a first width of adjacent third sub-wires of the second pattern region and a second width of adjacent fourth sub-wires of the second pattern region are the same as each other.

5. The lighting device according to claim 3, wherein a first width of adjacent first sub-wires of the first pattern region is different from a first width of adjacent third sub-wires of the second pattern region, and/or
wherein a second width of adjacent second sub-wires of the first pattern region is different from a second with of adjacent fourth sub-wires of the second pattern region.

6. The lighting device according to claim 5, wherein the first width of adjacent first sub-wires of the first pattern region is smaller than the first width of adjacent third sub-wires of the second pattern region, and/or wherein the second width of adjacent second sub-wires of the first pattern region is smaller than the second width of adjacent fourth sub-wires of the second pattern region.

7. The lighting device according to claim 2, wherein the closed opening in the first pattern region is defined as a first opening and the closed opening in the second pattern region is defined as a second opening, and wherein a size of the first opening is smaller than a size of the second opening.

8. The lighting device according to claim 7, wherein each of the first and second openings has a shape of a closed rectangle.

9. The lighting device according to claim 1, wherein each of the first electrode and the second electrode is formed with a transparent conductive material.

10. The lighting device according to claim 1, wherein the light blocking layer includes a plurality of light blocking pattern regions, and wherein the light blocking pattern regions overlap the first pattern region in a vertical direction and has an area greater than an area of the first pattern region.

11. The lighting device according to claim 10, wherein each of the light blocking pattern regions includes a plurality of unit light blocking patterns, and wherein a portion of each of the light blocking pattern regions overlaps the second pattern region in the vertical direction.

12. The lighting device according to claim 1, wherein the area of each of the light blocking pattern regions is within a range of 1.4 times or less than the area of the first pattern region.

13. The lighting device according to claim 1, wherein the light blocking layer comprises an optical film spaced apart from the transparent substrate.

14. The lighting device according to claim 13, further comprising an additional resin layer disposed between the transparent substrate and the light blocking layer.

15. The lighting device according to claim 1, wherein the reflective layer includes a plurality of reflective pattern regions, and wherein the plurality of light emitting devices do not overlap with the reflective pattern regions in the vertical direction.

16. The lighting device according to claim 1, wherein at least one of upper and lower surfaces of the resin layer has a curvature.

17. The lighting device according to claim 1, further comprising a half mirror layer disposed on the light blocking layer.

18. The lighting device according to claim 1, further comprising a protective layer disposed on the light blocking layer, wherein the resin layer is provided in a form bent in at least one direction among at least three different directions.

* * * * *